(12) United States Patent
Sugawara

(10) Patent No.: US 7,470,960 B1
(45) Date of Patent: Dec. 30, 2008

(54) HIGH-VOLTAGE POWER SEMICONDUCTOR DEVICE WITH BODY REGIONS OF ALTERNATING CONDUCTIVITY AND DECREASING THICKNESS

(75) Inventor: Yoshitaka Sugawara, Toyonaka (JP)

(73) Assignee: Kansai Electric Power Company, Inc, Osaka (JP)

(*) Notice: Subject to any disclaimer, the term of this patent is extended or adjusted under 35 U.S.C. 154(b) by 216 days.

(21) Appl. No.: 10/111,625

(22) PCT Filed: Oct. 24, 2000

(86) PCT No.: PCT/JP00/07444

§ 371 (c)(1),
(2), (4) Date: Oct. 20, 2004

(87) PCT Pub. No.: WO01/31710

PCT Pub. Date: Mar. 5, 2001

(30) Foreign Application Priority Data

Oct. 27, 1999 (JP) .................................. 11/306012

(51) Int. Cl.
H01L 29/08 (2006.01)

(52) U.S. Cl. ................................ 257/401; 257/E29.105

(58) Field of Classification Search ................. 257/339, 257/341, 342, 343, 401, 332, 335, E29.005, 257/E29.105, E29.109
See application file for complete search history.

(56) References Cited

U.S. PATENT DOCUMENTS

| | | | |
|---|---|---|---|
| 4,754,310 A * | 6/1988 | Coe ............................ | 257/287 |
| 5,304,827 A | 4/1994 | Malhi et al. | |
| 5,382,535 A | 1/1995 | Malhi et al. | |
| 5,701,026 A | 12/1997 | Fujishima et al. | |
| 5,844,275 A | 12/1998 | Kitamura et al. | |
| 5,885,878 A | 3/1999 | Fujishima et al. | |
| 6,097,063 A * | 8/2000 | Fujihira ...................... | 257/339 |
| 6,507,071 B1 * | 1/2003 | Tihanyi ....................... | 257/343 |

FOREIGN PATENT DOCUMENTS

| | | | |
|---|---|---|---|
| DE | 198 18 300 | * | 7/1999 |
| EP | 537684 | | 10/1991 |
| GB | 2309336 | | 7/1997 |
| JP | 02-016741 | | 1/1990 |
| JP | 11-274493 | | 10/1999 |
| JP | 2000-114518 | | 4/2000 |

OTHER PUBLICATIONS

"Veröffentlichungstag" translated by Google Translate. Retrieved from http://translate.google.com/translate_t?langpair=de|en on May 28, 2007.*
Hideyuki Fumino; Norio Yasuhara; Akio Nakagawa (Toshiba), High Voltage Lateral MOS, (May 20, 1996).
Yusuke Kawaguchi; Kautoshi Nakamura; Akihiro Yahata; Akio Nakagawa, Predicted Elec (May 26, 1999).
N. Cezac; F. Morancho; P. Rossel; H. Tranduc; A. Peyre, New Generation of Power Unipolar(May 22, 2000).
T. Minato; T. Nitta; A Uenisi; M. Yano; M. Harada; S. Hine, Which is Cooler, Trench or (May 22, 2000).

* cited by examiner

Primary Examiner—Lynne Gurley
Assistant Examiner—Andrew O Arena
(74) Attorney, Agent, or Firm—McIntyre-Lilley Intellectual Property Management Services

(57) ABSTRACT

A semiconductor device which eases an electric field at a drift portion without a reduction in impurity concentrations, and has a high withstand voltage and a low on-resistance, wherein, when a rated voltage is applied between a body region and a drain region formed on an insulating semiconductor substrate, the thicknesses of two, p-type and n-type, drift regions sandwiched between the body and drain regions are selected so as to completely deplete the drift regions.

4 Claims, 15 Drawing Sheets

HIGH-VOLTAGE POWER SEMICONDUCTOR DEVICE WITH BODY REGIONS OF ALTERNATING CONDUCTIVITY AND DECREASING THICKNESS

FIELD OF THE INVENTION

The present invention relates to a semiconductor device, and specifically relates to a power semiconductor device having a high withstand voltage.

BACKGROUND ART

Because a wide-gap semiconductor material typified by silicon carbide (abbreviated as SiC hereinafter) has higher dielectric breakdown electric field strength than that of a silicon (abbreviated as Si hereinafter) semiconductor material, it can realize a higher withstand voltage with the same impurity concentration as Si. Further, because SiC has a high withstand voltage while maintaining a low loss, operates at a high temperature of 250° C. or more, has an advantage of an excellent thermal conduction, it is expected as a material for a next generation power semiconductor.

In the "Proceedings of the 10th International Symposium on Power Semiconductor Devices & ICs" published in 1998 it is described a power MOS FET using SiC, and having a structure shown in FIG. 15 in pages 119 to 122. This power MOS FET is called as a trench gate type MOS FET, and an n-type drift layer 102 is formed on an n-type SiC semiconductor substrate 101 using epitaxial method. A p-type body region 103 is formed on the n-type drift layer 102, and n-type source regions 104 are formed on predetermined regions on the p-type body region. Recesses 110 are formed from the n-type source regions 104 and the p-type body region 103 to the n-type drift region 102, and gate electrodes 106 are formed in the recesses 110 through gate insulation films 105. A source electrode 107 is formed on the n-type source regions 104. A drain electrode 108 is formed on the bottom surface of the n-type SiC semiconductor substrate.

A channel for flowing carriers is formed between a source S and a drain D as follows. A voltage is impressed on the gate electrodes 106, and an electric field is applied to the gate insulation films 105 sandwiched between the gate electrodes 106 and the p-type body region 103 at sidewall parts of the recesses 110. As a result, the conductive type at surface parts of the p-type body region 103 in contact with the gate insulation films 105 is inversed to n-type, and the channel is formed. This structure provides a performance exceeding a theoretical limit of the Si power MOS FET, namely an on-resistance as low as 311 mΩ cm$^2$ per unit area with a withstand voltage of 1400 V.

Recently, high withstand voltage power ICs which are formed by integrating a control circuit and a protection circuit with a high withstand voltage power output element have been developed and realized, and contribute to reducing size and increasing intelligence of high withstand voltage semiconductor devices. Bipolar semiconductor devices typified by an IGBT and a thyristor are getting attentions in terms of increasing low loss property as the types of output elements for the high withstand voltage power ICs. The bipolar semiconductor devices use an effect of conductivity modulation to largely reduce an internal resistance of a semiconductor device compared with monopolar semiconductor devices typified by a MOS FET and an SIT, and have an advantage of largely increasing low loss property. While there are a vertical structure and a horizontal structure as structures of the high withstand voltage power output elements, the vertical structure is mainly adopted because of ease of combining with a control circuit, and integration. FIG. 16 shows an IGBT having a typical horizontal structure, and constituted using Si, and is disclosed on pages 101 to 104 in the "Proceedings of the 8th International Symposium on Power Semiconductor Devices & ICs" held in 1996.

A SiO2 insulating film 213 is formed on a Si substrate 201, and then and an n-type drift region 202 are laminated in the IGBT. A p-type body region 204 is formed on the right end of the laminated drift region 202, and an n-type emitter region 205 and a p-type contact region 214 are formed in it. An emitter electrode 218 is formed in the emitter region 205, and a base electrode 220 is formed in the contact region 214. A gate electrode 211 is provided on the p-type body region 204 thorough a gate oxide film 210. An n-type buffer region 206, a p-type collector region 207, and an anode electrode 219 are sequentially provided on the left end of the drift region 202.

The following section describes an operation of the IGBT when it is off. A high voltage is impressed such that the electric potential of the anode electrode 219 is higher than the electric potential of the emitter electrode 218. In this state, a junction formed between the p-type body region 204 and n-type drift region 202 is inversely biased, and a depletion layer extends mainly in the n-type drift region 202. An electric filed in the depletion layer is maximum in a neighborhood of the junction, and gradually decreases toward the n-type buffer region 206. When the impressed voltage increases further, the depletion layer further extends toward the n-type buffer region 206, and the maximum electric field in the neighborhood of the junction increases as well. An impressed voltage, which generates the maximum electric field reaching a dielectric breakdown electric field of SiC of about 0.3 MV/cm, is the breakdown withstands voltage of this IGBT.

The following section describes an operation for an on state. A voltage is impressed such that the electric potential of the anode electrode 219 is higher than the electric potential of the emitter electrode 218. In this state, when a voltage higher than a threshold voltage is impressed on the gate electrode 211, electrons are concentrated on the surface of the p-type body region 204 under the gate electrode 211, and an inversion layer is formed. As a result, electrons flow from the n-type emitter region 205 through the inversion layer. A part of the electrons reaches the n-type buffer region 206 through the n-type drift region 202, and induces an infusion of positive holes from the p-type collector region 207. The infused positive holes reach the p-type body region 204 through the n-type drift region 202, and flow out from the emitter electrode 218. In this state, both the electrons and the positive holes exist in the n-type drift region 202, and a conductivity modulation occurs. This drastically can reduce the resistance in the drift region. As a result, a semiconductor device can provide a low on-resistance, namely a low loss while it has a higher withstand voltage than a MOS FET.

The breakdown voltage is 340 V and the current-carrying capacity is 2 A for the present prior art. The on-voltage at a current density of 200 A/cm$^3$ is 2.0 V, and the on-resistance in a voltage range higher than the built-in voltage is 46.6 mΩcm$^2$.

When a semiconductor device is applied to an industrial high capacity inverter, an inverter for the electric railway such as the New Trunk Line and electric trains, and an electric power conversion system for the power industry, an inverter with a higher withstand voltage, and a lower loss is necessary. However, if a trench gate type MOS FET shown in FIG. 15 is used to increase the withstand voltage, it is necessary to reduce the impurity concentration in the drain region, to extend the depletion layer, and to reduce the electric field. As a result, the resistance in the drain region increases, the on-resistance increases when the semiconductor device is turned on for flowing a current, and reducing the loss becomes difficult. The electric field tends to concentrate at the bottom of the recess 110, and it is difficult to increase the withstand voltage. For a semiconductor device using SiC or Si, because the dielectric breakdown electric field is high, generally, the impurity concentration is increased in the drift layer 102, and the on-resistance is decreased. However, in that case, the electric field increases in the gate insulation film 105 at the bottom of the recess 110, and it is difficult to increase the withstand voltage.

The Si-IGBT shown in FIG. 16 has a low breakdown voltage, and is deficient in the withstand voltage for applying to an industrial high voltage inverter, an inverter for the electric railway such as the New Trunk Line and electric trains, and a high voltage electric power conversion system for the power industry, and it is necessary to increase the withstand voltage further. When the structure in FIG. 16 is used to increase the withstand voltage, it is necessary to decrease the impurity concentration in the drift region 202, to extend the depletion layer, and to decrease the electric field. However, this increases the resistance of the drift region 202, the on-resistance increases when the semiconductor is turned on, and a current flows, and it is difficult to reduce the loss. For example, when the breakdown voltage is 1000 V or more, the on-resistance is 400 m$\Omega$cm$^2$ or more in a voltage range higher than the built-in voltage, and when the breakdown voltage is 2000 V or more, the on-resistance is 2500 m$\Omega$cm$^2$ or more.

DISCLOSURE OF THE INVENTION

The purpose of the present invention is to provide a semiconductor device with a high withstand voltage that reduces an electric field in a drain region without reducing impurity concentration in a drain region, reduces an on-resistance, increases a withstand voltage, and increases reliability.

A wide gap semiconductor device according to the present invention comprises first conductive type first drift region formed on a high resistance substrate of a wide gap semiconductor, second conductive type second drift region having a similar thickness and similar impurity concentration to the said first drift region, and formed on the first drift region, a first conductive type buried region formed so as to be in contact with the said first and second drift regions, a first electrode formed in the buried region, second conductive type body region formed so as to be separated from the said buried region by a predetermined distance, and so as to be in contact with at least either one of the said first and second drift regions, a first conductive type region formed in a part of the said body region, a second electrode provided in the said body region and the said first conductive type region, and a control electrode formed in the said first drift region and the said body region, and is characterized in that the thickness of the said first and second drift regions is selected such that the first and second drift regions virtually become complete depletion layers when a voltage lower than a rated voltage is impressed between the said first electrode and the said second electrode.

A wide gap semiconductor device in an alternative respect according to the present invention comprises first conductive type first drift region formed on a high resistance substrate of a wide gap semiconductor, second conductive type second drift region having a similar thickness and similar impurity concentration to the first drift region, and formed on the said first drift region, a first conductive type buried region formed so as to be in contact with the said substrate, and the said first and second drift regions, a first electrode formed in the said buried region, second conductive type body region formed so as to be separated from the said buried region by a predetermined distance, and so as to be in contact with at least either one of the said first and second drift regions, a first conductive type region formed in a part of the said body region, a second electrode provided in the said body region and the said first conductive type region, and a control electrode provided in the said substrate, the first drift region, and the body region through an insulation film, and is characterized in that the thickness of the said first and second drift regions is selected such that the first and second drift regions virtually become complete depletion layers when a voltage lower than a rated voltage is impressed between the said first electrode and second electrode.

When a voltage is impressed such that the first electrode is at a higher electric potential, and the second electrode is at a lower electric potential in the wide gap semiconductor devices of the both inventions, a junction formed by the first conductive type region and the second conductive type body region is forward-biased, a low electric potential region extends in the second conductive type drift region. A high electric potential region extends in the first conductive type drift region through the buried region. As a result, a first junction formed by the first and second drift regions is reverse-biased, and depletion layer extends in both the first and second drift regions. Simultaneously, a second junction formed by the buried region and the second conductive type drift region is reverse-biased, and a depletion layer extends in the second conductive type drift region. Also, a third junction formed between the second conductive type body region, and the first conductive type drift region is simultaneously reverse-biased, a depletion layer extend in the first conductive type drift region. In this way, the depletion layers extend in both of the drift regions from the four sides, and the thickness of the first and second drift regions is decreased such that the first and second drift regions are almost completely depleted before the second and third junctions break down. Consequently, at least before the impressed voltage reaches the rated voltage of the semiconductor device, the drift regions are depleted completely. As a result, at least when a voltage close to the rated voltage is impressed, the distribution of the electric potential from the junction formed by the drift region and the buried region to the junction formed by the drift region and the body region is almost equal, and the electric field is almost equal across both of the drift regions. Because the impressed voltage can increase as high as this electric field reaches the dielectric breakdown electric field of the wide gap semiconductor, a high withstand voltage is realized.

Also, with these constitutions, the maximum dielectric breakdown electric field and the lengths of both of the drift regions determine the withstand voltage, and the withstand voltage is independent to the thickness of both of the drift regions. As the thickness of both of the drift region becomes thinner, a more complete depletion is realized, and a higher withstand voltage is provided even if the impurity concentration is high. Generally, there is such a relationship between the thickness of the depletion layer and the impurity concentration N as the thickness is approximately proportional to 1/N to the one-half power. When the thickness of both of the drift regions is decreased, and the thickness of the depletion layer is in this range, an effect on increasing the impurity concentration is remarkable. Namely, an effect on reducing the on-resistance is remarkable. With the conventional constitution, when the thickness of the drift region is reduced, and the impurity concentration is increased, though the on-resistance can be reduced, the withstand voltage decreases non-linearly. Thus, there is such a relationship as the on-resistance per unit area is proportional to the withstand voltage to the 2.5 power, and the on-resistance largely increases when the withstand voltage increases. With the structure of the present invention, though the withstand voltage is proportional to the length of the drift regions, the withstand voltage is independent to the thickness. Thus, the thickness is reduced to reduce the impurity concentration without degrading the withstand voltage, only the effect of reducing the on-resistance can be taken, and the on-resistance has such a relationship as it is proportional to the withstand voltage to the first power. Thus, with the present invention, when the thickness of the drift layer is reduced to the limit, in a semiconductor device having a withstand voltage of 1000 V or more, there is such a large effect as the on-resistance can present a double-digit or more reduction compared with the conventional structure in principle. When the impurity concentration is increased in the drift layer, because the built-in potential of the first junction exists, a resultant depletion layer is formed. Thus, when the thickness of the drift layer is reduced to the thickness of this depletion layer or less, there is no effect of reducing the on-resistance. This generates the limit for the thickness of the drift layer.

When the same voltage is impressed, the structure of the present invention presents a less local concentration of the electric field, and the lower maximum electric field compared with the conventional structure, and the reliability increases.

A wide gap semiconductor device in an alternative respect according to the present invention comprises multiple pairs of a first conductive type first drift region and a second conductive type second drift region formed on a high resistance substrate of a wide gap semiconductor, a first conductive type buried region formed on an inner wall surface of a first trench reaching to the substrate through the said multiple pairs of the first and second drift regions, a first electrode formed in the buried region, a second conductive type body region formed in the drift regions on the uppermost layer of the multiple pairs of the first and the second drift regions, a first conductive type region formed in a part of the body region, an insulation film formed on an inner wall surface of a second trench provided at a position separated from the first trench by a predetermined distance, and reaching to the substrate through the multiple pairs of the first and second drift regions, the body region, and the first conductive type region, a control electrode provided on the inner wall surface of the second trench through the insulation film, and a second electrode formed in the region and the body region.

A wide gap semiconductor device in an alternative respect according to the present invention comprises a second conductive type first drift region formed on a high resistance substrate of a wide gap semiconductor, a first conductive type second drift region having a virtually similar thickness and similar impurity concentration to the first drift region, and formed on the first drift region, a first conductive type buried region formed so as to be in contact with the substrate, and the first and second drift regions, a first electrode formed in the buried region, a second conductive type body region formed so as to be separated from the buried region by a predetermined distance, and so as to be in contact with the substrate, and the first and second drift regions, a first conductive type region formed in a part of the body region, a second electrode provided in the region and the body region, and a control electrode provided in the body region through an insulation film, and is characterized in that the thickness of the first and second drift regions is selected such that the first and second drift regions virtually become complete depletion layers when a voltage lower than a rated voltage is impressed between the first electrode and second electrode.

A wide gap semiconductor device in an alternative respect according to the present invention comprises a first conductive type first drift region formed on a high resistance substrate of a wide gap semiconductor, a second conductive type second drift region having a virtually similar thickness and similar impurity concentration to the first drift region, and formed on the first drift region, a first conductive type buried region formed so as to be in contact with the first and second drift regions, a first electrode formed in the buried region, a second conductive type body region formed in the first drift region so as to be separated from the buried region by a predetermined distance, and so as to be in contact with the first and second drift regions, a first conductive type region formed in a part of the body region, a second electrode provided in the region, and a control electrode provided on a second body region in the first drift region, and the region through an insulation film, and is characterized in that the thickness of the first and second drift regions is selected such that the first and second drift regions virtually become complete depletion layers when a voltage lower than a rated voltage is impressed between the first electrode and second electrode.

A wide gap semiconductor device in an alternative respect according to the present invention comprises a first conductive type first drift region using a low resistance second type material, and formed on a substrate of a wide gap semiconductor using a high resistance first type material, a second conductive type second drift region using the second type material, having a virtually similar thickness and similar impurity concentration to the first drift region, and formed on the first drift region, a first conductive type buried region formed so as to be in contact with the first and second drift regions, a first electrode formed in the buried region, a second conductive type body region formed so as to be separated from the buried region by a predetermined distance, and so as to be in contact with the first and second drift regions, a first conductive type region formed in a part of the body region, a second electrode provided in the region, and a control electrode provided through an insulation film on an inner wall surface of a trench reaching to the first drift region through the body region, and is characterized in that the thickness of the first and second drift regions is selected such that the first and second drift regions virtually become complete depletion layers when a voltage lower than a rated voltage is impressed between the first electrode and second electrode.

A semiconductor device of the present invention comprises a first conductive type first drift region formed on a high resistance substrate of a wide gap semiconductor, a second conductive type second drift region having a similar thickness and similar impurity concentration to the first drift region, and formed on the first drift region, a first conductive type buried region formed so as to be in contact with the first and second drift regions, a first electrode formed in the buried region, a second conductive type body region formed so as to be separated from the buried region by a predetermined distance, and so as to be in contact with at least either one of the first and second drift regions, a first conductive type region formed in a part of the body region, a second electrode provided in the body region and the first conductive type region, and a control electrode formed in the first drift region and the body region, and is characterized in that the thickness of the first and second drift regions is selected such that the first and second drift regions virtually become complete depletion layers when a voltage lower than a rated voltage is impressed between the first electrode and second electrode.

A wide gap semiconductor device in an alternative respect according to the present invention comprises a first conductive type first drift region formed on a high resistance substrate of a wide gap semiconductor, a second conductive type second drift region having a similar thickness and similar impurity concentration to the first drift region, and formed on the first drift region, a first conductive type buried region formed so as to be in contact with the substrate, and the first and second drift regions, a first electrode formed in the buried region, a second conductive type body region formed so as to be separated from the buried region by a predetermined distance, and so as to be in contact with at least either one of the first and second drift regions, a first conductive type region formed in a part of the body region, a second electrode provided in the body region and the first conductive type regions, and a control electrode formed in the substrate, the first drift region, and the body region through an insulation film, and is characterized in that the thickness of the first and second drift regions is selected such that the first and second drift regions virtually become complete depletion layers when a voltage lower than a rated voltage is impressed between the first electrode and second electrode.

When a voltage is impressed such that the first electrode is at a higher electric potential, and the second electrode is at a lower electric potential in the wide gap semiconductor devices of the both inventions, a junction formed by the first conductive type region and the second conductive type body region is forward-biased, a low electric potential region extends in the second conductive type drift region. A high electric potential region extends in the first conductive type drift region through the buried region. As a result, a first junction formed by the first and second drift regions is reverse-biased, and depletion layer extends in both the first and second drift regions. Simultaneously, a second junction formed by the buried region 6 and the second conductive type drift region 3 is reverse-biased, and a depletion layer extends in the second conductive type drift region. Also, a third junction formed between the second conductive type body region, and the first conductive type drift region is simultaneously reverse-biased, a depletion layer extend in the first conductive type drift region. In this way, the depletion layers extend in both of the drift regions from the four sides. The thickness of the first and second drift regions is decreased such that the first and second drift regions are almost completely depleted before the second and third junctions break down. Consequently, at least before the impressed voltage reaches the rated voltage of the semiconductor device, the drift regions are depleted completely. As a result, at least when a voltage close to the rated voltage is impressed, the distribution of the electric potential from the junction formed by the drift region and the buried region to the junction formed by the drift region and the body region is almost equal, and the electric field is almost equal across both of the drift regions. Because the impressed voltage can increase as high as this electric field reaches the dielectric breakdown electric field of the wide gap semiconductor, a high withstand voltage is realized.

Also, with these constitutions, the maximum dielectric breakdown electric field and the lengths of both of the drift regions determine the withstand voltage, and the withstand voltage is independent to the thickness of both of the drift regions. As the thickness of both of the drift region becomes thinner, a more complete depletion is realized, and a higher withstand voltage is provided even if the impurity concentration is high. Generally, there is such a relationship between the thickness of the depletion layer and the impurity concentration N as the thickness is approximately proportional to 1/N to the one-half power. When the thickness of both of the drift regions is decreased, and the thickness of the depletion layer is in this range, an effect on increasing the impurity concentration is remarkable. Namely, an effect on reducing the on-resistance is remarkable. With the conventional constitution, when the thickness of the drift region is reduced, and the impurity concentration is increased, though the on-resistance can be reduced, the withstand voltage decreases non-linearly. Thus, there is such a relationship as the on-resistance per unit area is proportional to the withstand voltage to the 2.5 power, and the on-resistance largely increases when the withstand voltage increases. With the structure of the present invention, though the withstand voltage is proportional to the length of the drift regions, the withstand voltage is independent to the thickness. Thus, the thickness is reduced to reduce the impurity concentration without degrading the withstand voltage, only the effect of reducing the on-resistance can be enjoyed, and the on-resistance has such a relationship as it is proportional to the withstand voltage to the first power. Thus, with the present invention, when the thickness of the drift layer is reduced to the limit, in a semiconductor device having a withstand voltage of 1000 V or more, there is such a large effect as the on-resistance can present a double-digit reduction compared with the conventional structure in principle. When the impurity concentration is increased in the drift layer, because the built-in potential of the first junction exists, a resultant depletion layer is formed. Thus, when the thickness of the drift layer is reduced to the thickness of this depletion layer or less, there is no effect of reducing the on-resistance. This generates the limit for the thickness of the drift layer. When the same voltage is impressed, the structure of the present invention presents a less local concentration of the electric field, and the lower maximum electric field compared with the conventional structure, and the reliability increases.

A wide gap semiconductor device in an alternative respect according to the present invention comprises multiple pairs of a first conductive type first drift region and a second conductive type second drift region formed on a high resistance substrate of a wide gap semiconductor, a first conductive type buried region formed on an inner wall surface of a first trench reaching to the substrate through the multiple pairs of the first and second drift regions, a first electrode formed in the buried region, a second conductive type body region formed in the drift regions on the uppermost layer of the multiple pairs of the first and the second drift regions, a first conductive type region formed in a part of the body region, an insulation film formed on an inner wall surface of a second trench provided at a position separated from the first trench by a predetermined distance, and reaching to the substrate through the multiple pairs of the first and second drift regions, the body region, and the first conductive type region, a control electrode provided on the inner wall of the second trench through the insulation film, and a second electrode provided in the region and the body region.

A semiconductor device in an alternative respect according to the present invention comprises a second conductive type first drift region formed on a high resistance substrate of a wide gap semiconductor, a first conductive type second drift region having a virtually similar thickness and similar impurity concentration to the first drift region, and formed on the first drift region, a first conductive type buried region formed so as to be in contact with the substrate, and the first and second drift regions, a first electrode formed in the buried region, a second conductive type body region formed so as to be separated from the buried region by a predetermined distance, and so as to be in contact with the substrate, and the first and second drift regions, a first conductive type region formed in a part of the body region, a second electrode provided in the region and the body region, and a control electrode formed in the body region through an insulation film, and is characterized in that the thickness of the first and second drift regions is selected such that the first and second drift regions virtually become complete depletion layers when a voltage lower than a rated voltage is impressed between the first electrode and second electrode.

A semiconductor device in an alternative respect according to the present invention comprises a first conductive type first drift region formed on a high resistance substrate of a wide gap semiconductor, a second conductive type second drift region having a virtually similar thickness and similar impurity concentration to the first drift region, and formed on the first drift region, a first conductive type buried region formed so as to be in contact with the first and second drift regions, a first electrode formed in the buried region, a second conductive type body region formed in the first drift regions so as to be separated from the buried region by a predetermined distance, and so as to be in contact with the first and second drift regions, a first conductive type region formed in a part of the body region, a second electrode provided in the region, and a control electrode provided on a second body region in the first drift region, and the region through an insulation film, and is characterized in that the thickness of the first and second drift regions is selected such that the first and second drift regions virtually become complete depletion layers when a voltage lower than a rated voltage is impressed between the first electrode and second electrode.

A semiconductor device in an alternative respect according to the present invention comprises a first conductive type first drift region using a low resistance second type material, and formed on a substrate of the wide gap semiconductor using a high resistance first type material, a second conductive type second drift region using the second type material, having a virtually similar thickness and similar impurity concentration to the first drift region, and formed on the first drift region, a first conductive type buried region formed so as to be in contact with the first and second drift regions, a first electrode formed in the buried region, a second conductive type body region formed so as to be separated from the buried region by a predetermined distance, and so as to be in contact with the first and second drift regions, a first conductive type region formed in a part of the body region, a second electrode provided in the region, and a control electrode provided through an insulation film on an inner wall surface of a trench reaching to the first drift region through the body region, and is characterized in that the thickness of the first and second drift regions is selected such that the first and second drift regions virtually become complete depletion layers when a voltage lower than a rated voltage is impressed between the first electrode and second electrode.

A wide gap bipolar semiconductor device in an alternative respect according to the present invention comprises a first conductive type first drift region formed on a high resistance substrate of a wide gap semiconductor, a second conductive type second drift region formed on a part of said first drift region, a second conductive type third drift region formed in a part of said first drift region, and having impurity concentration equal to or higher than impurity concentration of the second conductive type second drift region, a first conductive type first region formed in said third drift region, and having high impurity concentration, a first conductive type second region formed so as to be in contact with said first and second drift regions, and having impurity concentration higher than that of said first and second drift regions, a second conductive type third region formed so as to be in contact with said first conductive type second region, and having high impurity concentration, a first electrode formed in said first conductive type first region, a second electrode formed in said second conductive type third region and a control electrode opposing to said first drift region, said third drift region, and said first region through an insulation film, and is characterized in that the thickness of said first drift region and the thickness of said second drift region are virtually the same, the individual thicknesses are smaller than the individual lengths, and the thickness of said first and second drift regions is selected such that said first and second drift regions virtually become complete depletion layers when a voltage close to a rated voltage is impressed between said first electrode and second electrode.

When a high voltage is impressed such that the second electrode is at a higher electric potential, and the first electrode is at a lower electric potential in the semiconductor device described above, because a voltage in the forward direction is impressed on a junction constituted by the first conductive type first region and the second conductive type second regions, the second conductive type drift regions are at a low electric potential. The first conductive type first drift regions are at a high electric potential through the second conductive type third regions and the first conductive type second regions. As a result, a voltage in a reverse direction is impressed on a first junction constituted by the first and second drift regions, and depletion layers extend in both the first and second drift regions. Simultaneously, a second junction constituted by the first conductive type second regions and the second conductive type second drift regions is reverse-biased, and depletion layers extend in the second conductive type second drift regions. Also, a voltage in a reverse direction is impressed on a third junction constituted by the second conductive type third drift regions, and the first conductive type first drift regions, depletion layers extend in the first conductive type first drift regions.

In this way, the depletion layers extend in both of the first and second drift regions in the vertical and horizontal directions. The first conductive type first drift regions, and the second conductive type second drift regions are easily and almost completely depleted before the second and third junctions break down, namely before the impressed voltage reaches the rated voltage of the semiconductor device. As a result, at least when a voltage close to the rated voltage is impressed, the distribution of the electric potential from the junction constituted by the second drift regions and the second regions to the junction constituted by the first drift regions and the third drift regions is almost equal, and the electric field is almost uniform across both of the drift regions. Because the impressed voltage can increase as high as this electric field reaches the dielectric breakdown electric field of the semiconductor material, a high withstand voltage is realized.

In the conventional structure, even when a drift region with a constant impurity concentration is provided, the electric field in the depletion layer increases at a constant gradient, and becomes the maximum at the junction. When the impressed voltage increases, and the electric field at the junction reaches the dielectric breakdown voltage, a breakdown occurs. On the other hand, in the structure of the present invention, the withstand voltage is an integral value of the electric field in the depletion layer when the electric field reaches the dielectric breakdown voltage. Because the electric field becomes the constant dielectric breakdown voltage in the drift regions at the breakdown, the withstand voltage can be higher than that of the conventional structure in principle.

Also, with the constitution of the present invention, the maximum dielectric breakdown electric field and the lengths of the first and second of the drift regions determine the withstand voltage, and the withstand voltage is independent to the thickness of both of the drift regions. As the thickness of both of the drift regions becomes thinner, both of the drift regions are easily and completely depleted, and a higher withstand voltage is provided even if the impurity concentration is high. Generally, there is such a relationship between the thickness of the depletion layer and the impurity concentration N as the thickness is approximately proportional to 1/N to the one-half power. When the thickness of both of the drift regions is decreased, because the impurity concentration can increase in proportional to the thickness to the second, an effect on reducing the on-resistance is remarkable.

With the conventional constitution, when the thickness of the drift region is reduced, and the impurity concentration is increased, though the on-resistance can be reduced, the withstand voltage decreases non-linearly. Thus, there is such a relationship as the on-resistance per unit area is proportional to the withstand voltage to the 2.5 power, and the on-resistance largely increases when the withstand voltage increases. With the structure of the present invention, though the withstand voltage is proportional to the length of the drift regions, because the withstand voltage is independent to the thickness, the thickness is reduced to reduce the impurity concentration, and the on-resistance reduces while a high withstand voltage is maintained. Namely the on-resistance has such a relationship as it is proportional to the withstand voltage to the first power. Thus, with the present invention, when the thickness of the drift layer is reduced to the limit, there is such a large effect as the on-resistance can present a double-digit reduction in principle compared with the conventional structure in a semiconductor device having a withstand voltage of 1000 V or more. When the impurity concentration is increased in the drift layer, because the built-in potential of the first junction exists, a depletion layer is formed as a result. Thus, when the thickness of the drift layer is reduced to the thickness of this depletion layer or less, there is no effect of reducing the on-resistance. This generates the limit for the thickness of the drift layer. When the same voltage is impressed, the structure of the present invention presents a less local concentration of the electric field, and the lower maximum electric field compared with the conventional structure, and the reliability increases.

A semiconductor device in an alternative respect according to the present invention comprises multiple pairs of a first conductive type first drift region and a second conductive type second drift region formed on a high resistance substrate of a wide gap semiconductor, a first conductive type first buried region formed on an inner wall surface of a first trench reaching to the substrate through the multiple pairs of the first and second drift regions, a second conductive type second buried region formed so as to be in contact with the first buried region, a first electrode formed in the second buried region, a second conductive type body region formed so as to be in contact with the drift regions on the uppermost layer of the multiple pairs of the first and the second drift regions, a first conductive type region formed in a part of the body region, an insulation film formed on an inner wall surface of a second trench provided at a position separated from the first trench by a predetermined distance, and reaching to the substrate through the multiple pairs of the first and second drift regions, the body region, and the first conductive type region, a control electrode provided on the inner wall surface of the second trench through the insulation film, and a second electrode provided in the region and the body region.

A semiconductor device in an alternative respect according to the present invention comprises multiple pairs of a first conductive type first drift region and a second conductive type second drift region formed on a substrate through an insulation film, a first conductive type first buried region formed on an inner wall surface of a first trench reaching to the substrate through the multiple pairs of the first and second drift regions, a second conductive type second buried region formed so as to be in contact with the first buried region, a first electrode formed in the second buried region, a second conductive type body region formed so as to be in contact with the drift regions on the uppermost layer of the multiple pairs of the first and the second drift regions, a first conductive type region formed in a part of the body region, an insulation film formed on an inner wall surface of a second trench provided at a position separated from the first trench by a predetermined distance, and reaching to the substrate through the multiple pairs of the first and second drift regions, the body region, and the first conductive type region, a control electrode provided on the inner wall surface of the second trench through the insulation film, and a second electrode provided in the region and the body region.

A semiconductor device in an alternative respect according to the present invention comprises multiple pairs of a first conductive type first drift region and a second conductive type second drift region formed on a high resistance substrate of a wide gap semiconductor, a first conductive type first buried region formed on an inner wall surface of a first trench reaching to the substrate through the multiple pairs of the first and second drift regions, a second conductive type second buried region formed so as to be in contact with the first buried region, a first electrode formed in the second buried region, a second conductive type contact formed in the drift regions on the uppermost layer of the multiple pairs of the first and the second drift regions, a second conductive type base region formed on an inner wall surface of a second trench provided at a position separated from the first trench by a predetermined distance, and reaching to the substrate through the multiple pairs of the first and second drift regions, and the contact, a second electrode provided in the base region in the second trench, and a third electrode provided in the contact.

A semiconductor device in an alternative respect according to the present invention comprises multiple pairs of a first conductive type first drift region and a second conductive type second drift region formed on a high resistance substrate of a wide gap semiconductor, a first conductive type first buried region formed on an inner wall surface of a first trench reaching to the substrate through the multiple pairs of the first and second drift regions, a second conductive type second buried region formed so as to be in contact with the first buried region, a first electrode formed in the second buried region, a second conductive type base region formed on an inner wall surface of a second trench provided at a position separated from the first trench by a predetermined distance, and reaching to the substrate through the multiple pairs of the first and second drift regions, a second electrode provided in the base region in the second trench, and a third electrode opposing to the first buried region and second buried region through an insulation film.

A semiconductor device in an alternative respect according to the present invention comprises at least one of a first pair of a first conductive type semiconductor region and a second conductive type semiconductor region formed on a substrate, at least one of a second pair of a first conductive type semiconductor region and a second conductive type semiconductor region in contact with one end of the first pair of semiconductor regions, at least one of a third pair of a first conductive type semiconductor region and a second conductive type semiconductor region in contact with the other end of the first pair of semiconductor regions, and a control electrode for providing the third pair of semiconductor regions with an electric field, and is characterized by that the shape and the thickness of the first pair of semiconductor regions are selected such that the entire first pair of semiconductor regions are depleted when a voltage is impressed both on the second pair of the semiconductor regions and the third pair of the semiconductor regions such that the electric potential of the second pair of the semiconductor regions is higher than the electric potential of the third pair of the semiconductor regions, and electrons flow from the third pair of the semiconductor regions into the second pair of the semiconductor regions through the first pair of the semiconductor regions, and holes flow from the second pair of the semiconductor regions into the third pair of the semiconductor regions through the first pair of the semiconductor regions, and electrons and holes coexist in the first pair of the semiconductor regions when a voltage is impressed on both the second pair of the semiconductor regions and the third pair of the semiconductor regions such that the electric potential of the second pair of the semiconductor regions is higher than the electric potential of the third pair of the semiconductor regions, and a voltage more than a threshold is impressed on the control electrode.

BEST MODE FOR CARRYING OUT THE INVENTION

The following section details preferred embodiments of the present invention while referring to FIG. 1 to FIG. 14. Many segments are formed next to one another in the horizontal direction of the drawings in semiconductor devices of the individual embodiments. Numerals are provided for individual elements in one segment at the center in the individual drawings.

First Embodiment

Figure 1:
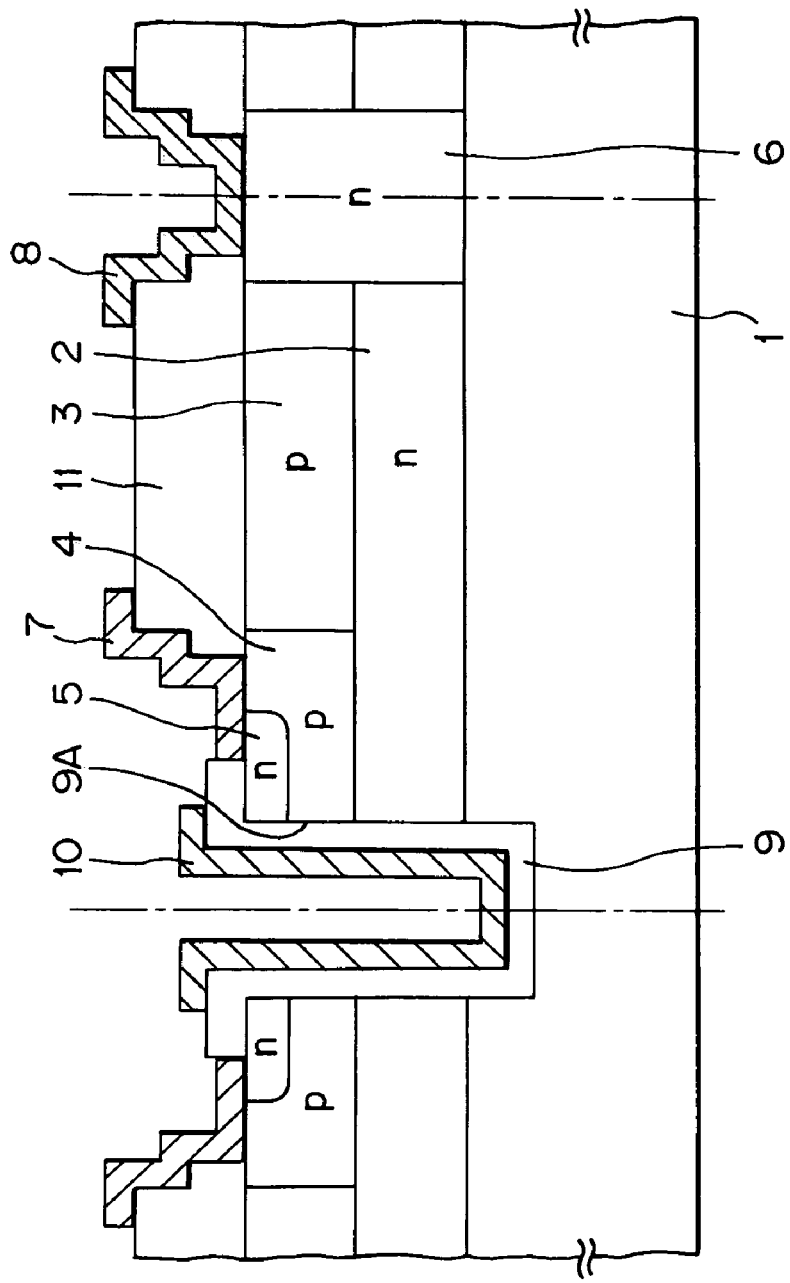
FIG. 1 is a section view of a first embodiment of a field effect transistor of the present invention.

FIG. 1 is a section view of a semiconductor device of a first embodiment of the present invention. The first embodiment is a wide gap semiconductor device, and is a SiC field effect transistor with a withstand voltage of 6100 V. FIG. 1 shows a sectional structure of segments. A dielectric substrate 1 in the drawing is an extremely high resistance wide gap SiC (silicone carbide) substrate including impurities forming a deep energy level such as vanadium, the resistance ratio is $10^9$ Ωcm or more, and the thickness (a vertical dimension in the drawing) is about 350 µm. A semiconductor device using a SiC substrate is generally referred to a wide gap semiconductor. A first conductive type n-type drift region 2, and a second conductive type p-type drift region 3 formed thereon have approximately the same thickness (virtually the similar thickness), and the same impurity concentration, the thickness is about 0.8 µm and the impurity concentration is about $8 \times 10^{16}$ atm/cm$^3$. With the constitution of the present embodiment, the withstand voltage is dependent to the differences in the thickness and the impurity concentration of the p-type drift region and the n-type drift region, and the withstand voltage increases as the differences decrease. To efficiently attain the purpose of the present invention, it is preferable that the difference in the thickness between the p-type drift region and the n-type drift region is ±20% or less, and the difference in the impurity concentration is ±250% or less. A p-type body region 4 having the impurity concentration of about $5 \times 10^{17}$ atm/cm$^3$ is formed on the left side of the p-type drift region 3, and an n-type source region 5 having the impurity concentration of $1 \times 10^{19}$ atm/cm$^3$, and the thickness of about 0.2 µm is formed therein. On the right side, an n-type drain region, which is a buried region, and has a high impurity concentration of $1 \times 10^{19}$ atm/cm$^3$, is formed so as to reach the substrate 1, the n-type drift region 2, and the p-type drift region 3. The length of the drift region 2, namely the distance between the body region 4 and the drain region 6 is about 52 µm. A groove, namely a trench 10A, reaching to the dielectric substrate 1 is formed in the p-type body region 4. A gate electrode 10 is provided on the trench 10A through an oxide film as a gate insulation film 9. A source electrode 7 is provided in the body region 4 and the source region 5. A drain electrode 8 is provided in the drain region 6. A Si oxide film, or a Si nitride film 11 is formed on the surface of the p-type drift region 3 for protecting the surface.

The following section describes an example of creating the SiC field effect transistor of the present embodiment. First, the SiC dielectric substrate 1 is prepared, the n-type drift layer 2 having a predetermined low impurity concentration of $5 \times 10^{15}$ to $3 \times 10^{17}$ atm/cm$^3$, and a predetermined thickness of 0.1 to 2.0 µm is formed on one surface of the substrate 1, and then the p-type drift region 3 with almost the same thickness and the same impurity concentration is formed using vapor phase epitaxy, or the like. Then, the p-type body region 4 of about $6\times10^{17}$ atm/cm$^3$, and the n-type drain region 6 of about $1\times10^{19}$ atm/cm$^3$ are formed with ion implantation or the like. When the ion implantation is used, it is preferable that the implantation is repeated for several times while implantation energy is changed from high energy to low energy, and an almost uniform impurity concentration distribution is formed. Then, the n-type source region 5 having the impurity concentration of about $1\times10^{19}$ atm/cm$^3$ is formed using nitrogen ion implantation or the like. Then, the trench 10A is formed, and the gate oxide film 9 is formed on the inner wall of it. After that, the surface protection film 11, which is an insulation film such as a Si oxide film or a Si nitride film, is formed using chemical vapor deposition. Finally, the insulation film is removed at contacts of the source region 5, the body region 4, and the drain region 6, a metal film such as Al is formed on predetermined regions, and the source electrode 7, the gate electrode 10, and the drain electrode 8 are formed.

The following section describes the operation of the present embodiment. When a high voltage is impressed such that the electric potential of the drain electrode 8 is higher than the electric potential of the source electrode 7 in the SiC field effect transistor of the present invention, a junction constituted by the drift regions 2 and 3 are reverse-biased. As a result, a depletion layer extends in both the drift regions 2 and 3, and almost entire drift regions 2 and 3 are completely depleted. The electric potential distribution in the drift regions 2 and 3 from the junction formed by the drift region 3 and the drain region 6 to the junction formed by the drift region 2 and the body region 4 presents almost an equal electric potential distribution. Namely, the electric field is almost uniform across the entire drift regions 2 and 3, and it is possible to increase the impressed voltage as high as the electric field reaches the dielectric break down electric field of SiC of about 3 MV/cm. As a result, the withstand voltage of the SiC field effect transistor can increase. The high withstand voltage of 6200 V is attained in the present embodiment.

When a high voltage is impressed, an electric field concentration may be present in a neighborhood of the surface of the junction formed by the drift region 3 and the drain region 6, and the withstand voltage may be restricted. It is effective to relax the electric field concentration for increasing the withstand voltage. The electric field relaxing technique, so-called filed plate, which extends the drain electrode 8 over the drift region 3 through the thick surface protection film 11 is applied to the present embodiment for relaxing this electric field concentration. Because the electric field concentration may be present at corners of the trench 10A, and the withstand voltage is restricted, it is effective to apply electric field relaxing to these parts as well. The trench 10 A is formed so deep as to enter into the dielectric substrate 1, and to connect the gate insulation film 9 with the dielectric substrate 1, and the thickness of the insulation film at the corners largely increases in practice for relaxing the electric field in the present embodiment. When it is structured such that the trench 10A is shallow and does not reach the dielectric substrate 1, it is effective to provide a p-type region in the trench 10A for relaxing the electric field, and it attains the same purpose of the present embodiment.

When a voltage higher than a threshold voltage (6 V in the present embodiment) such as 10 V is impressed on the gate electrode 10, an field effect through the gate insulation film 9 forms a channel on the surface of the body region 4. As a result, an on state, namely a state where a current flows from the source region 5 to the drain region 6 through this channel is present. This current flows through the drift region 2 to the drain region 6. Because the drift regions 2 and 3 are completely depleted even when the impurity concentration in the drift regions 2 and 3 is increased, a high withstand voltage is attained in the present embodiment. Because the impurity concentration is high in both the drift regions 2 and 3, a low resistance is present during on. Because the impurity concentration can increase by about two digits without inversely affecting the withstand voltage in principle, a large effect of decreasing the on-resistance by about two digits is attained. A low on-resistance of 140 mΩcm$^2$ is attained in the present embodiment.

Figure 2:
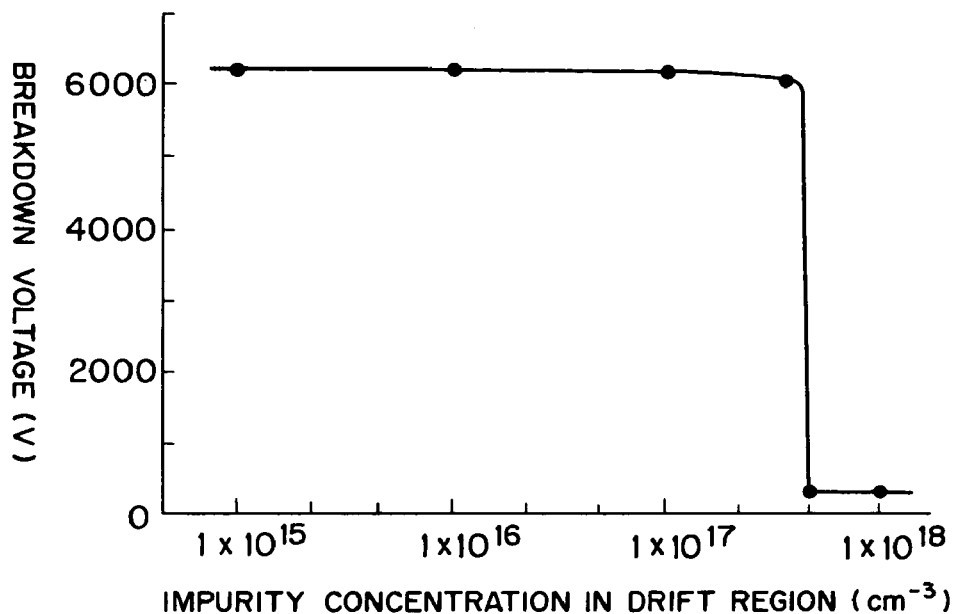
FIG. 2 is a chart of a relationship between the withstand voltage and the impurity concentration in a drift region of the field effect transistor of the first embodiment of the present invention.
Figure 3:
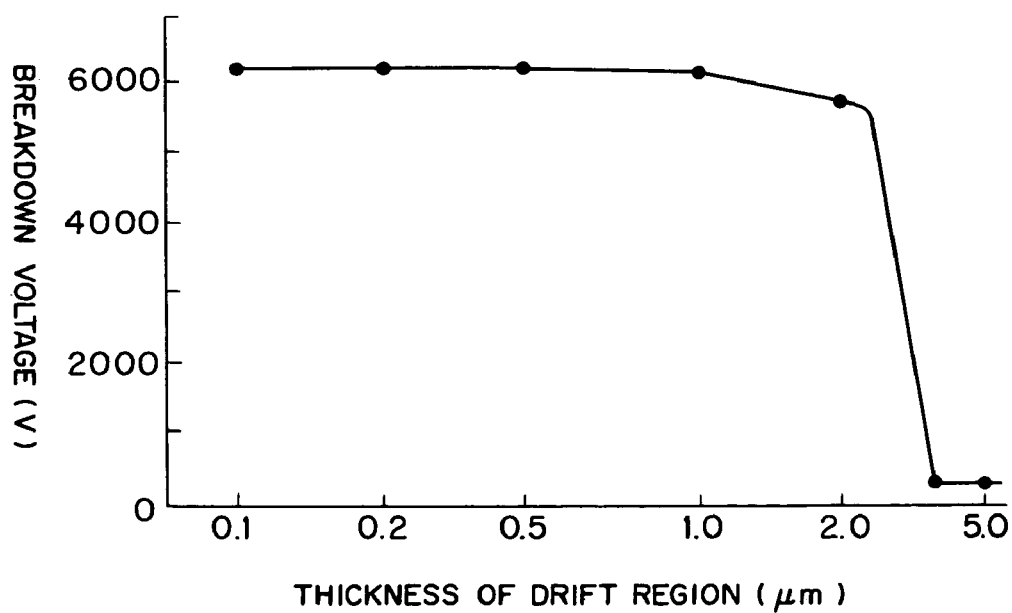
FIG. 3 is a chart of a relationship between the withstand voltage and the thickness of the drift region of the field effect transistor of the first embodiment of the present invention.

While the thickness and the impurity concentration of the n-type drift region 2 and the p-type drift region 3 formed on that are set to 0.8 μm and about $8\times10^{16}$ atm/cm$^3$ in the present embodiment, an SiC field effect transistor having a high withstand voltage and a low loss is obtained as long as the thickness is from 0.1 μm to 1.2 μm, and the impurity concentration is from about $5\times10^{15}$ atm/cm$^3$ to $3\times10^{17}$ atm/cm$^3$ as experimental data of the inventors indicate in FIG. 2. and FIG. 3. The withstand voltage largely decreases when the thickness is 1.4 μm or more, and the impurity concentration is $3\times10^{17}$ atm/cm$^3$ or more, because a breakdown occurs at the junction formed by the drift region 2 and the body region 4 before both the drift regions 2 and 3 are completely depleted.

While the individual segments have stripe shapes in a direction orthogonal to the page in FIG. 1 of the present embodiment, they may take such shapes as circles and rectangles. While the body region 4 has the same thickness as the drift region 3 in the present embodiment, increasing or decreasing the thickness of the body region 4 provides the same effect. Decreasing the thickness of the body region 4 and interposing the drift region 3 between the body region 4 and the drift region 2 provides a similar effect. While the drain region 6 is formed so deep as to come in contact with the dielectric substrate 1, it may be formed so shallow as to come in contact only with the drift region 2. In this case, though the shallowness makes the production easy, electric field concentration may occur at the corners of the drift regions 2, and the withstand voltage may decrease.

Second Embodiment

Figure 4:
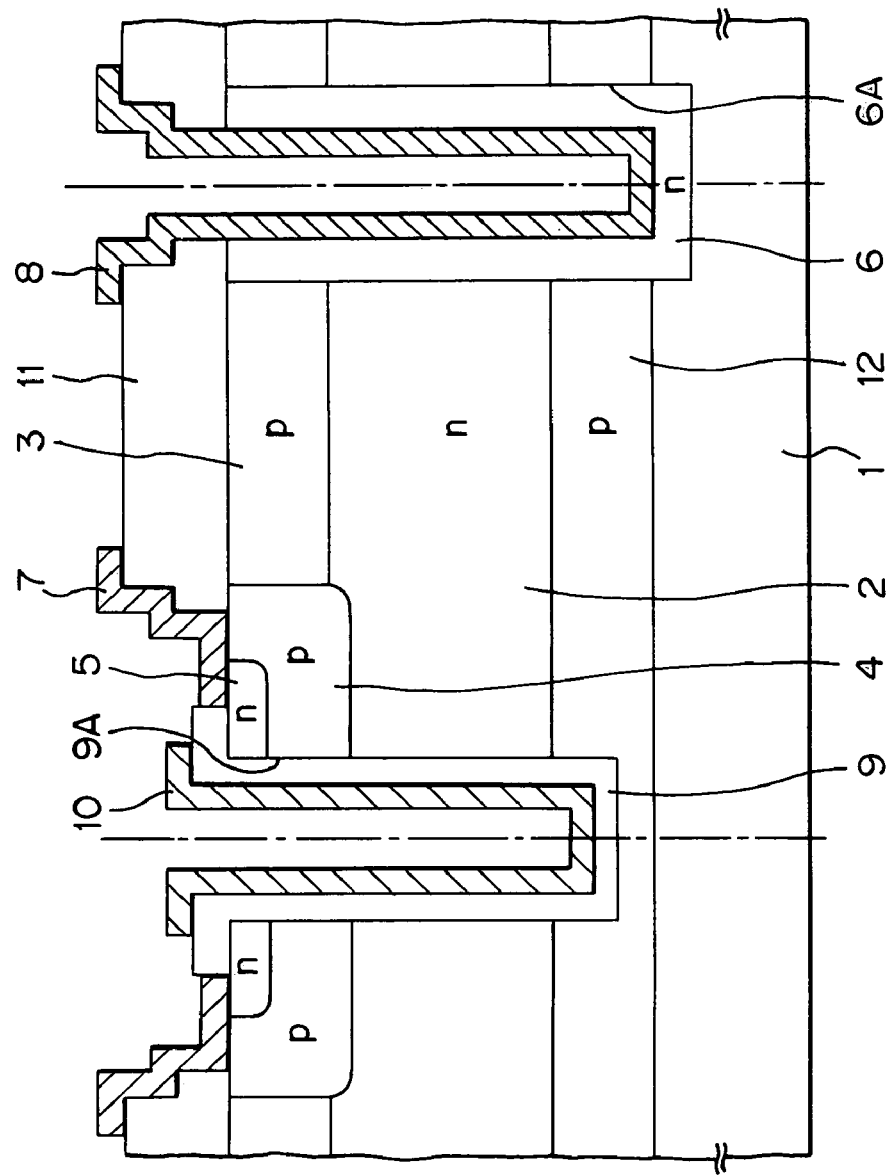
FIG. 4 is a section view of a second embodiment of the field effect transistor of the present invention.

FIG. 4 is a section view for showing segments of a SiC field effect transistor of a second embodiment of the present invention. The second embodiment is the same as the first embodiment except for the following three points.

(1) A p-type drift region 12 thinner than the drift region 3 is provided between the drift region 2 and the dielectric substrate 1.

(2) The n-type drain region 6 is formed along the inner wall of a trench 6A reaching to the dielectric substrate 1, the drain region 6 connects with the drift regions 2, 3, and 12, and the drain electrode 8 is provided on the surface of the drain region 6.

(3) The trench 9A is formed so deep as to reach the drift region 12 for the gate electrode 10, and the oxide film 9 and the gate electrode 10 are formed along the inner wall of this trench.

The thickness of the n-type drift region 2 is 1.3 μm, the thickness of the p-type drift regions 3 and 12 is 0.8 μm, and individual impurity concentrations are about $7\times10^{16}$ atm/cm$^3$, and approximately equal. The depth of the trench 6A is about 3.5 μm, and the width is about 8 μm. The depth of the trench 9A is about 2.5 μm, and the width is about 6 μm.

The n-type drift region 2 is sandwiched between the two p-type drift regions 3 and 12 in the field effect transistor of the present embodiment. As a result, when a high voltage is impressed such that the electric potential of the drain electrode 8 is higher than the electric potential of the source electrode 7, the junction formed by the drift regions 2 and 3, and a junction formed by the drift regions 12 and 2 are simultaneously reverse-biased, and depletion layers extend to the drift region 2 from both the drift regions 3 and 12. Because the thickness of the drift layer 2 is more than twice of the thickness of the drift region 3, the drift layer 2 is almost completely depleted when a predetermined high voltage depletes the drift layers 3 and 12. As a result, the electric potential distribution of the drift regions 2, 3, and 12 is approximately an equal electric field distribution from the drain electrode 8 to the gate electrode 10. Namely, the electric field is approximately uniform across the entire region of the drift regions 2, 3, and 12. Because it is possible to increase the impressed voltage so high that the electric field reaches the dielectric breakdown electric field of SiC of about 3 MV/cm, the withstand voltage can increase, and a high withstand voltage of 6100 V is attained in the present embodiment.

A current flows through a channel formed in the body region 4 and the drift region 2 from the region 5 in the on state where a voltage higher than a threshold voltage is impressed on the gate electrode 10. Because the thickness of the drift region 2 is about 1.6 times of the thickness of the drift region 3, and the depletion layers caused by the building voltages of the upper and lower junctions of the drift region 2 decrease the thickness of the drift region more or less, the resistance of the drift regions 2, 3, and 12 is less than about 1/1.6 or less of the case where the thicknesses of the drift regions 2 and 3 are the same. Because the resistance decreases in this way, the on-resistance as low as 90 mΩcm$^2$ is achieved in the present embodiment.

As described above, the present embodiment provides an effect that the on-resistance can be further decreased while the high withstand voltage is maintained. While the depth and the width of the trench 9A of the gate electrode 10 are different from those of the trench 6A of the drain region 6 in the present embodiment, the depth may be about as deep as that of the trench 6A, and may reach the dielectric substrate. In this case, the electric field concentration at a part of the corners of the trench 9A is further relaxed, and the withstand voltage and the reliability increase.

Third Embodiment

Figure 5:
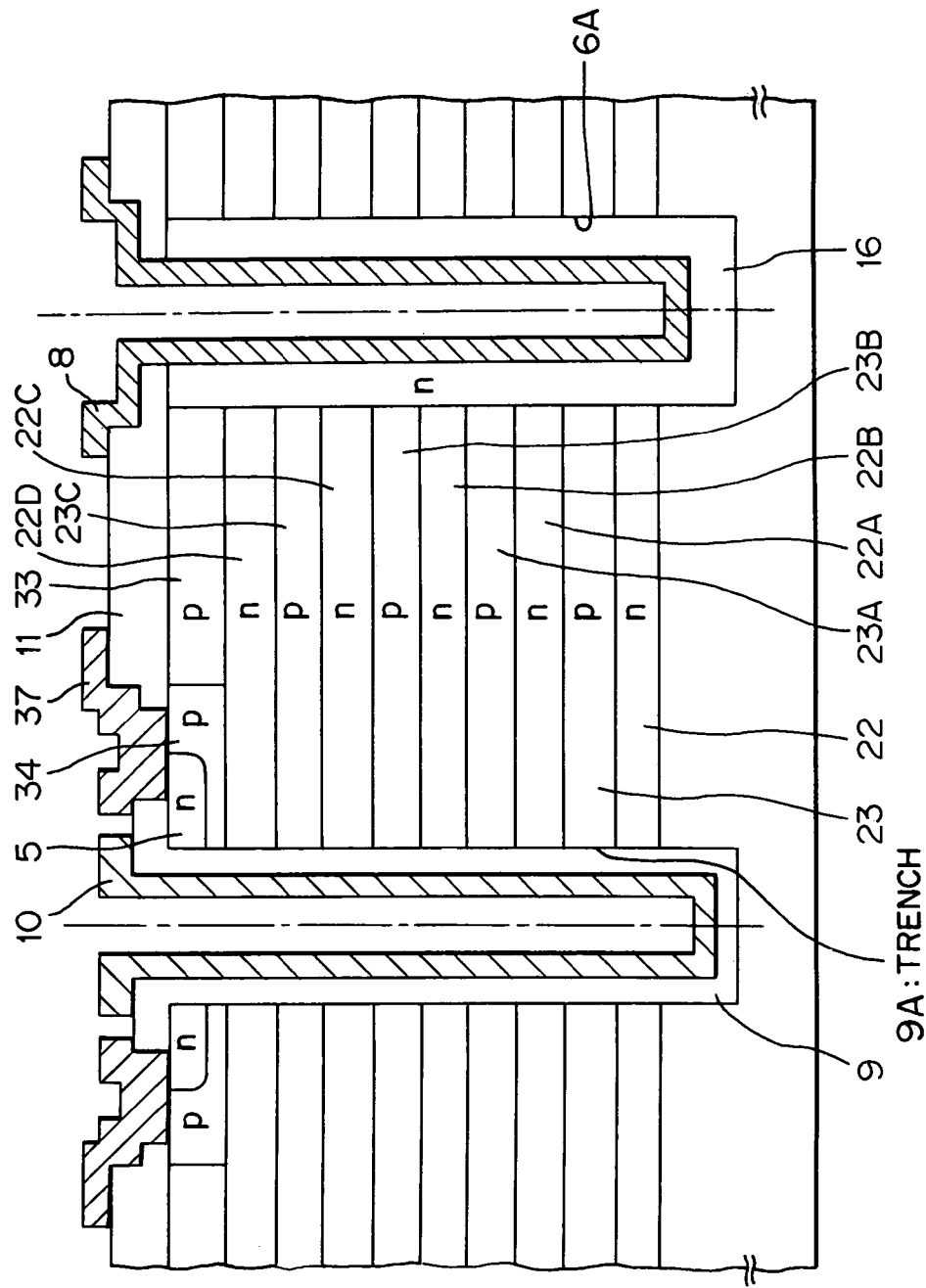
FIG. 5 is a section view of a third embodiment of the field effect transistor of the present invention.

FIG. 5 is a segment section view of a SiC field effect transistor of a third embodiment of the present invention. Five pairs of an n-type drift region and a p-type drift region are sequentially laminated such that p-type drift regions 23, 23A, 23B, and 23C are respectively laminated between n-type drift regions 22, 22A, 22B, and 22C on the SiC dielectric substrate 1 with the thickness of 320 μm. The trenches 6A and 9A are provided so as to reach the dielectric substrate 1 on both ends of the laminated individual drift regions 22 and 23. The trench 9A is for a gate part, and the gate electrode 10 is provided through the gate oxide film 9. The trench 6A is for a drain part, and a drain region 16 and the drain electrode 8 are provided on the inner wall. A p-type body region 34, the n-type source region 5, and a source electrode 37 connected with these regions are provided on the gate part side of the upper most layer of a p-type drift region 33. The surface protection film 11 such as a Si oxide film or a Si nitride film is provided for protection on the surface of the p-type drift region 33. The thicknesses of both of the n-type and p-type drift regions 22 and 23 are about 0.8 μm, the impurity concentrations are about 8×10$^{16}$ atm/cm$^3$, the lengths of them are bout 75 μm. The impurity concentration of the p-type body region 34 is about 5×10$^{17}$ atm/cm$^3$, and the thickness is about 0.8 μm, and the impurity concentration of the n-type source region 5 formed in it is about 1×10$^{19}$ atm/cm$^3$, and the thickness is about 0.2 μm. The impurity concentration of the drain region 16 is about 1×10$^{19}$ atm/cm$^3$, and the depth of the trench 6A is about 10 μm.

The n-type drift region 22 is sandwiched between the two p-type drift regions 23 in the field effect transistor of the present embodiment. In the same way, the p-type drift region 23 is sandwiched between the two n-type drift regions 22. With this constitution, when a high voltage is impressed such that the electric potential of the drift electrode 8 is higher than the electric potential of the source electrode 37, depletion layers extend from the both sides in the individual drift regions 22 and 23, and the drift regions are almost completely depleted. As a result, the electric potential distributions from the drain electrode 8 to the gate electrode 10 in the drift regions 22 and 23 are almost equal electric potential distributions, and the electric filed is almost uniform across the entire region of the drift regions 22 and 23. Because it is possible to increase the impressed voltage so high as the electric field reaches the dielectric breakdown electric field of SiC of about 3 MV/cm, the withstand voltage can increase. A high withstand voltage of 8300 V is attained in the present embodiment.

On the other hand, electrons are concentrated on the surfaces of the body region 4 and the individual drift regions 2 and 3 opposing to the gate electrode 10, and inversion layers are formed in the on state where a voltage is impressed such that the drain electrode 8 is at a higher electric potential than the source electrode 7, and a voltage higher than the threshold is impressed on the gate. Electrons are also concentrated on the surfaces of parts of the individual drift regions 2 and 3 opposing to the gate electrode 10, and accumulation layers are formed. The inversion layer in the body region 4 serves as a channel, and a current flows from the source region 5 to the drain region 16 through the channel, and the n-type drift region 22D, which is the second upper most layer. A part of the current is distributed to the n-type drift region 22C as the fourth layer through the accumulation layer of the n-type drift layer 22D, and the inversion layer of the third upper most layer of the p-type drift region 23C, and flows to the drain region 6. In the same way, a part of the current is distributed to the n-type drift region 22A close to the substrate 1 through the accumulation layer of the n-type drift region 22C, and the inversion layer of the p-type drift region 23B, and flows to the drain 6. As the n-type drift layer is closer to the substrate 1, the resistances of the accumulation layers of the n-type drift regions 22 and the inversion layers of the p-type drift regions 23 are added. Thus, though the resistance increases more or less, and the distributed current tends to decrease, it is not a level of causing a problem in the present embodiment. The combined resistance of the n-type drift regions 2, 2A, 2B, 2C, and 2D decreases to about one fifth of that of the constitution of FIG. 1, and the on-resistance of the field effect transistor largely reduces. In the present embodiment, the on-resistance per unit area is largely reduced to 47 mΩcm$^2$ in the drift region while the withstand voltage is as high as 8300 V.

Figure 6:
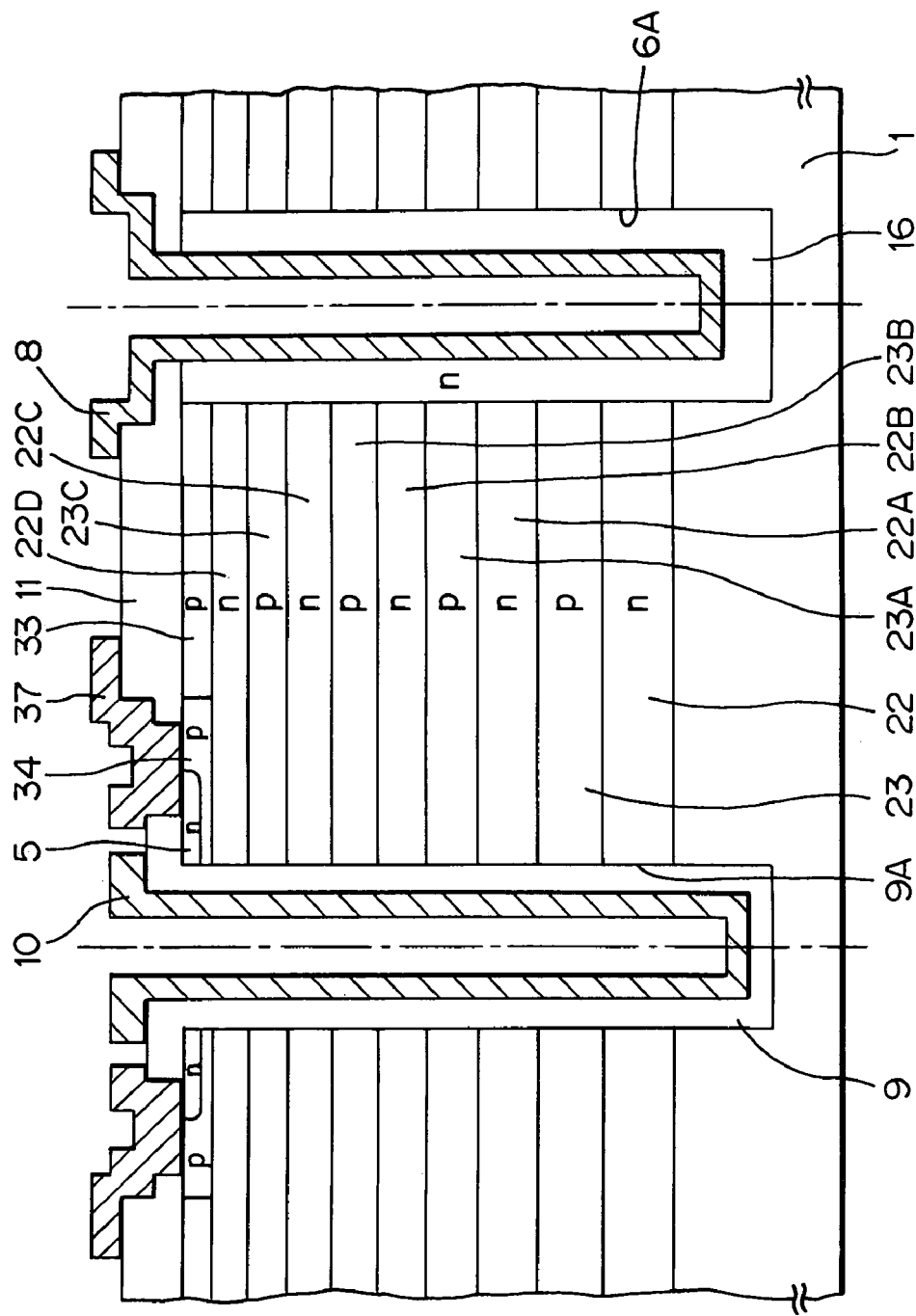
FIG. 6 is a section view of an alternative example of a third embodiment of the field effect transistor of the present invention.

As described above, the present embodiment provides an effect of largely decreasing the on-resistance further without degrading the withstand voltage. The on-resistance decreases as the number of the accumulated layers of the pairs of the n-type drain regions 22, 22A, . . . , and the p-type drain regions 23, 23A, . . . , increases. However, the number of accumulated layers increases excessively, because of such the phenomenon as the resistances of the individual inversion layers are added as described above, the resistances of the n-type and the p-type drift regions on the lower layers increase. Thus, a technique to equalize the resistance in the upper and lower n-type and p-type drift regions is necessary. For example, such a constitution as the thickness of the lower layers of the n-type and p-type drift regions are increased more is extremely effective as shown in FIG. 6. The increment ratio of thickness of the lower most layer of the drift region 22 to that of the upper most layer of the drift region 33 depends on the lengths of the horizontal direction in the drawing of the individual drift regions, and the number of the pairs of the n-type drift regions 22, and the p-type drift regions 23, and about 1.3 times is preferable when the number of the pairs is 15, for example. While the thickness of both of the p-type and n-type drift regions 22 and 23 sequentially increases as they become lower in FIG. 6, the same effect is provided when only the thickness of the n-type drift regions sequentially increases while the thickness of the p-type drift regions is maintained constant. In this case, it is preferable that the thickness of the lower most layer of the n-type drift region 22 is about 1.3 times of the thickness of the upper most layer of the n-type drift region.

Fourth Embodiment

Figure 7:
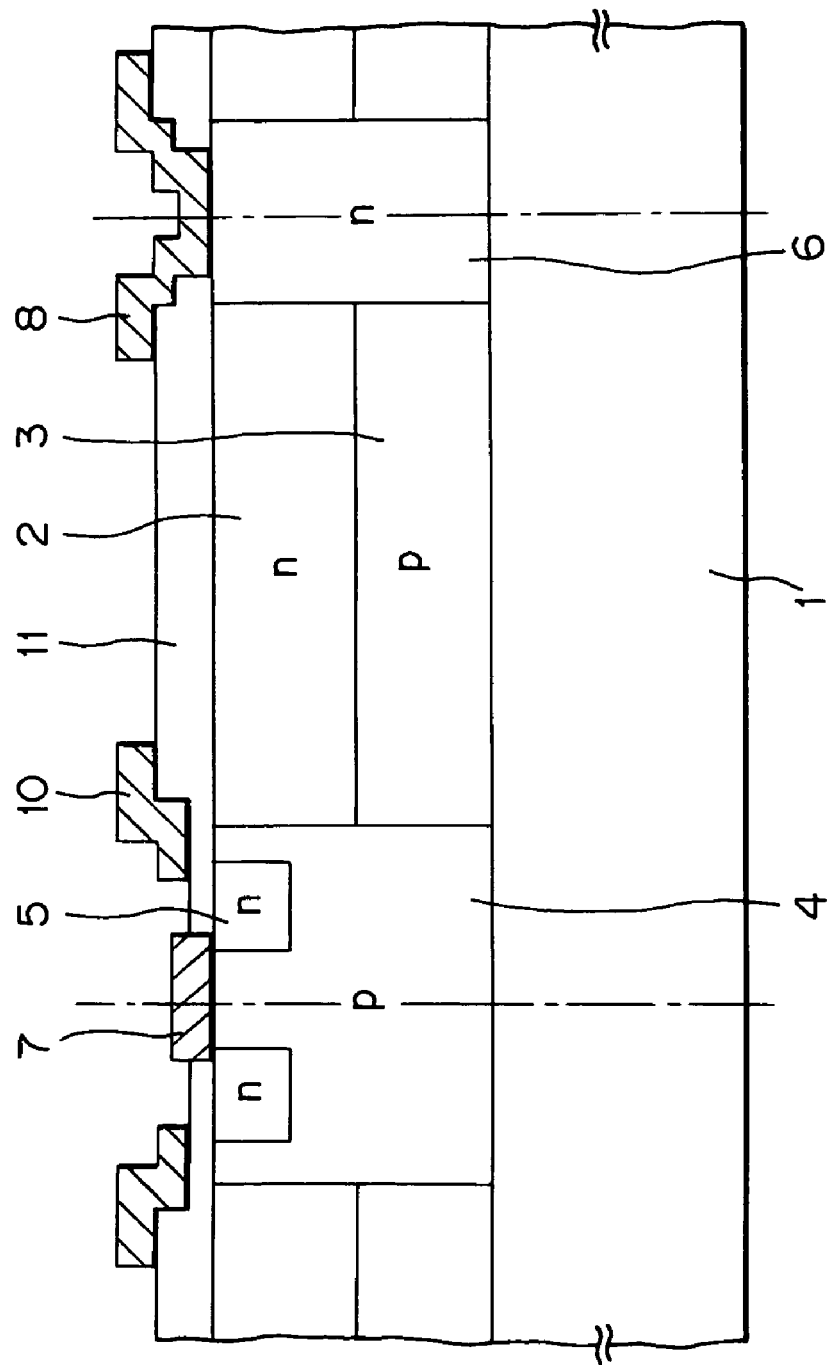
FIG. 7 is a section view of a fourth embodiment of the field effect transistor of the present invention.

FIG. 7 is a section view of segments of a SiC field effect transistor of a fourth embodiment of the present invention. A gate part including the gate electrode 10 has a planer structure in the present embodiment, and the drift region in contact with the dielectric substrate 1 is p type, and the drift region 2 on it is n type. Excepting that the polarity is changed, and the n-type drain region 6 and the p-type body region 4 reach the dielectric substrate 1, the other structure is almost the same as that of the embodiment 1. The thicknesses, the lengths, and the impurity concentrations of the drift regions 2 and 3 are almost the same as those in the first embodiment. The impurity concentrations of the n-type source region 5 and the p-type body regions 4 are the same as those in the first embodiment.

The function of both of the drift regions 2 and 3 is basically the same as that in the first embodiment when a high voltage is impressed, and this constitution also provides a high withstand voltage. The on-operation is basically the same. When a voltage more than the threshold voltage is impressed on the gate electrode 10 while a voltage is impressed on the source electrode 7 and the drain electrode 8, the polarity of a surface electric field of a body region 40 directly under the gate electrode 10 is reversed, and a channel is formed. As a result, a current flows from the source electrode 7 to the n-type drift region 2 through this channel, and flows into the drain 8.

The present embodiment realizes the SiC field effect transistor having the withstand voltage of 6100 V and the on-resistance of 130 mΩcm². Only implanting ions such as boron forms the p-type body region 40, and implanting ions such as nitrogen forms the source region 5 without forming the trenches 6A and 10A as shown in FIG. 4 in the present embodiment, and the embodiment has such a characteristic as the fabrication is very simple.

Fifth Embodiment

Figure 8:
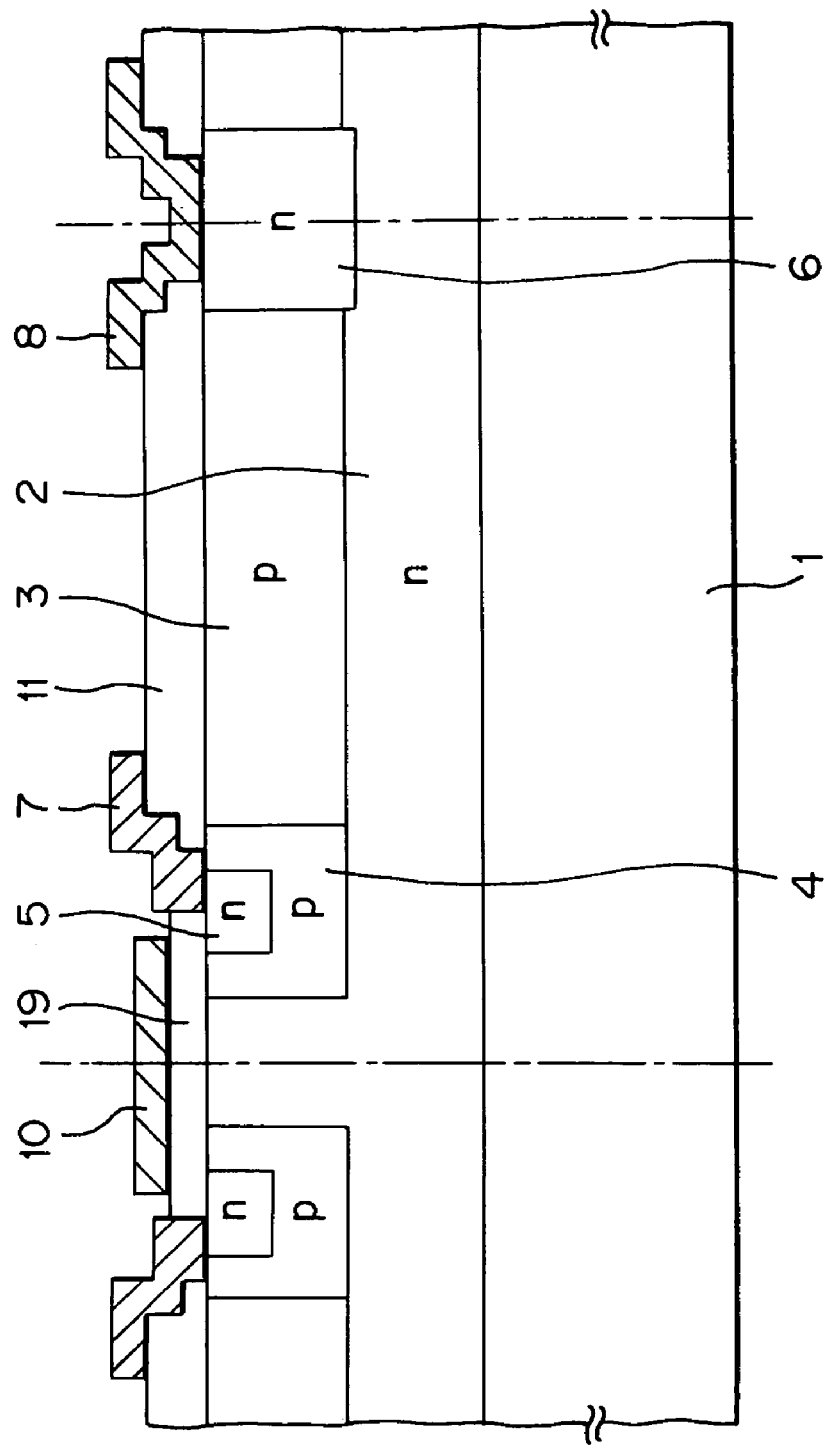
FIG. 8 is a section view of a fifth embodiment of the field effect transistor of the present invention.

FIG. 8 is a section view of segments of a SiC field effect transistor of a fifth embodiment of the present invention. Excepting that a gate part including the gate electrode 10 has a planer structure, and the n-type drift region 2 extends to a surface directly below the gate electrode 10, the other structure is almost the same as that in the first embodiment in the present embodiment. The thickness, the length, and the impurity concentration of the drift regions 2 and 3 are almost the same as those in the first embodiment. The impurity concentration in the n-type source region 5 and the p-type body region 4 is almost the same as that in the first embodiment.

The function of both of the drift regions 2 and 3 when a high voltage is impressed is basically the same as that of the first embodiment, and the similar high breakdown voltage is realized. The on-operation is basically the same. When a voltage larger than the threshold is impressed on the gate electrode 10 while a voltage is impressed on the source electrode 7 and the drain electrode 8, the electric field on the surface of the p-type body region 4 directly under the gate electrode 10 is reversed, a channel is formed, and a current flows from the source electrode 7 to the drain electrode 8. This current passes through the n-type drift region 2 directly under the gate electrode 10, and then trough the n-type drift region 2 under the p-type drift region 3, and reaches the drain region 6.

The SiC field effect transistor of the present embodiment presents the breakdown voltage of 6200 V, and the on-resistance of 150 mΩcm². Because only implanting ions such as boron forms the p-type body region 4, and implanting ions such as nitrogen forms the n-type source region 5 without forming trenches, the present embodiment has such a characteristic as the fabrication is very simple.

Sixth Embodiment

Figure 9:
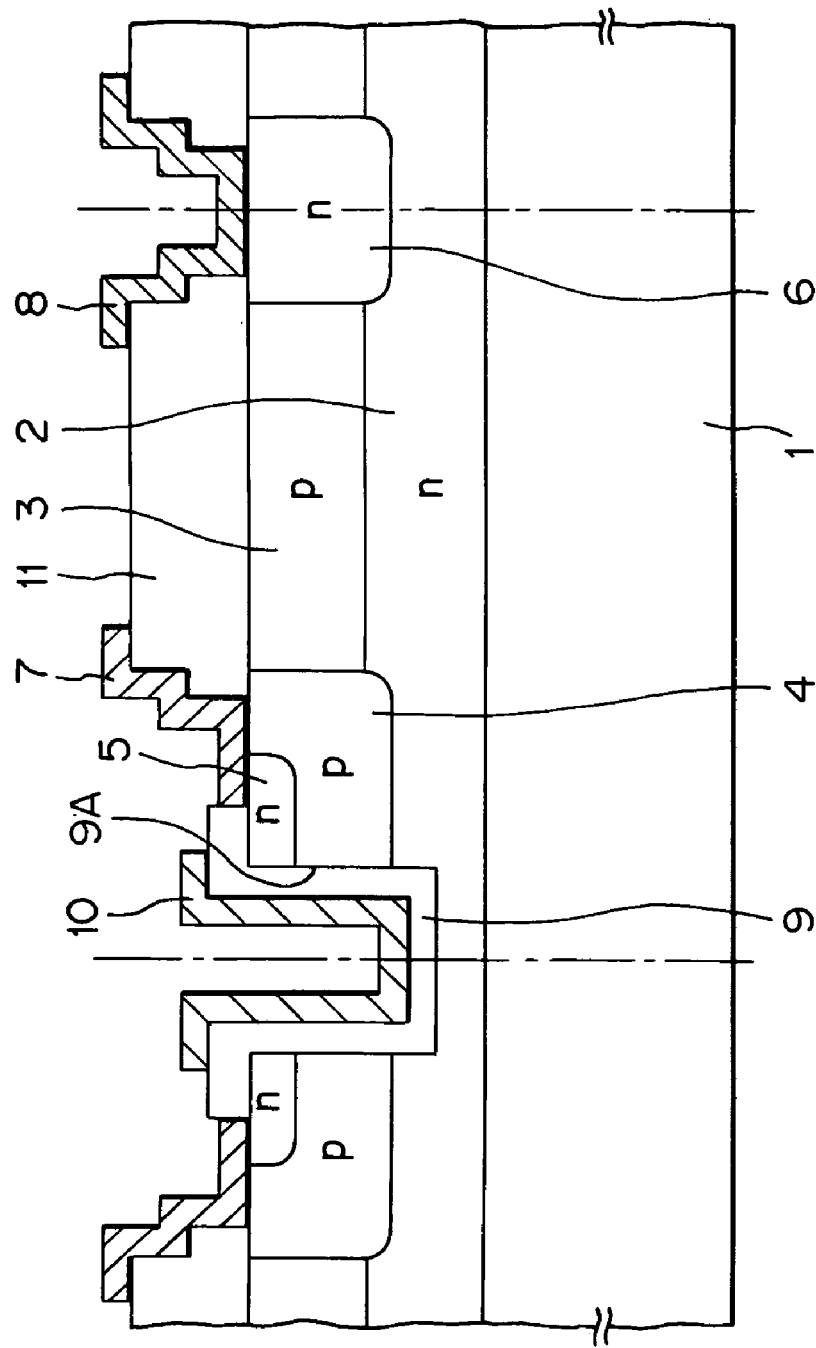
FIG. 9 is a section view of a sixth embodiment of the field effect transistor of the present invention.

FIG. 9 is a section view of segments of a gallium nitride (described as GaN hereafter) field effect transistor of a six embodiment of the present embodiment. The dielectric substrate 1 is a SiC substrate including impurities such as vanadium, the resistively is $10^9$ Ωcm or more, and the thickness is about 350 μm. The n-type drift region 2 and the p-type drift region 3 formed thereon have almost the same thickness and impurity concentration, the thickness is about 0.8 μm, and the impurity concentration is about $8\times10^{16}$ atm/cm³ in GaN. The p-type body region 4 having the impurity concentration of about $5\times10^{17}$ atm/cm³ is formed on the left end of the p-type drift region 3. The n-type source region 5 having the impurity concentration of $1\times10^{19}$ atm/cm³ and the thickness of about 0.2 μm is formed in the body region 4. The n-type drain region 6 having a high impurity concentration of $1\times10^{19}$ atm/cm³ is formed so as to be in contact with the n-type drift region 2 on the right end. The length of the drift region 3, namely the distance between the body region 4 and the drain region 6, is about 50 μm. The trench 9A is formed such that it penetrates through the p-type body region 4, and reaches the drift region 2, and the gate electrode 10 is formed on the inner wall of the trench 9A through the oxide film 9. The source electrode 7 is formed in the body region 4 and the source region 5, and the drain electrode 8 is formed in the drain region 6. The Si nitride film 11 is formed on the surface of the p-type drift region 3 for surface protection.

While the operation of the present embodiment is almost the same as the embodiment 1, because GaN has more excellent physical and electrical properties than the SiC, GaN is preferable for the power semiconductor device. A GaN field effect transistor having the breakdown voltage of 6600 V, and the on-resistance of 80 mΩcm² is obtained in the present embodiment. GaN has better compatibility with the Si nitride film as the surface protection film 11 than SiC, and the reliability increases further. GaN has a higher saturation speed of electrons than SiC, and is suitable for a high-speed operation. The cut-off frequency of 6 GHz is realized in the present embodiment.

Seventh Embodiment

Figure 10:
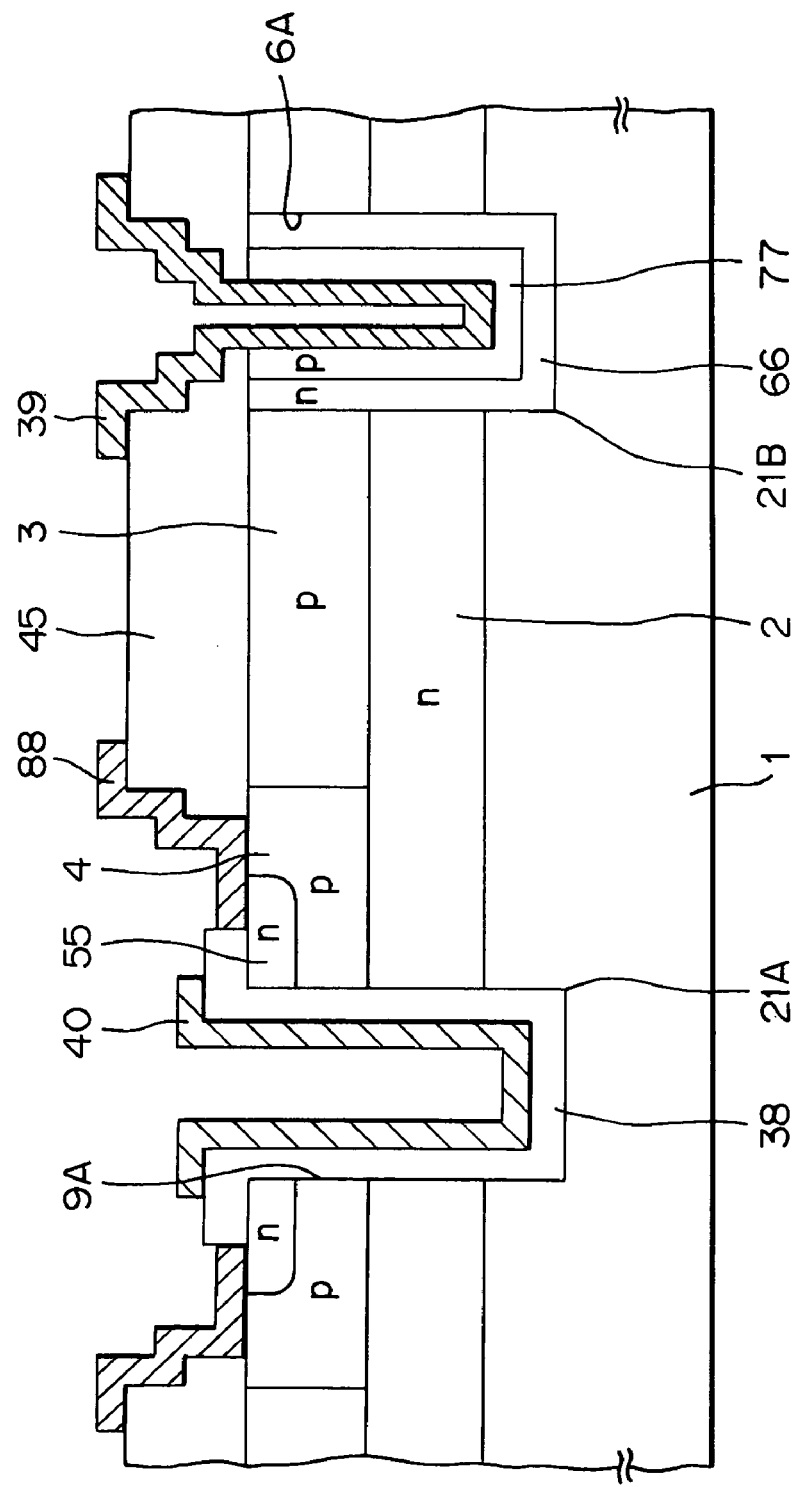
FIG. 10 is a section view of a SiC-IGBT of a seventh embodiment of the present invention.

FIG. 10 is a section view of a semiconductor device of a seventh embodiment of the present invention, and shows a section structure of segments of an insulated gate bipolar transistor (described as IGBT hereafter) having the breakdown voltage of 6100 V. The semiconductor device of the seventh embodiment is fabricated using SiC. Because a wide gap semiconductor material typified by SiC has higher dielectric breakdown electric field intensity than silicone (Si), it realizes a higher breakdown voltage than a semiconductor using Si while the impurity concentration is the same. Namely, the semiconductor has such advantages as it has a high breakdown voltage while maintaining a low loss, and operates at a high temperature of 250° C. or more, and presents excellent thermal conductivity. The dielectric substrate 1 is a SiC substrate containing impurities such as vanadium that forms a deep energy level in FIG. 10. Its resistivity is $10^9$ Ωcm or more, and the thickness is about 350 μm. The n-type first drift region 2 and the p-type second drift region 3 formed thereon have almost the same thickness and impurity concentration, the thickness is about 0.8 μm, and the impurity concentration is about $8\times10^{16}$ atm/cm$^3$.

The p-type body region 4 having the impurity concentration of about $5\times10^{17}$ atm/cm$^3$ is formed in contact with one end of the drift region 3, and an n-type emitter region 55 having the impurity concentration of $1\times10^{19}$ atm/cm$^3$ and the thickness of about 0.2 μm is formed therein. The first trench 6A, which is a trench reaching to the dielectric substrate 1, is formed on the other end of the drift region 3. An n-type buffer region 66 as a first buried region having the impurity concentration of $1\times10^{18}$ atm/cm$^3$ is formed so as to be in contact with the drift regions 2 and 3 on the inner wall of the trench 6A. A p-type collector region 77 as a second buried region having the impurity concentration of $1\times10^{20}$ atm/cm$^3$ is formed on the surface of the n-type buffer region 66, and a collector electrode 39 is formed so deep as to reach the dielectric substrate 1 in the collector region 77. The length of the drift region 3, namely the distance between the body region 4 and the buffer region 66, is about 52 μm.

The second trench 9A is formed so as to reach the dielectric substrate 1 in the neighborhood of the p-type body region 4. A gate electrode 40 is provided on the inner wall surface of the trench 9A through a gate insulation film 38. An emitter electrode 88 is provided so as to be in contact with the body region 4 and an emitter region 55. An Si oxide film or an Si nitride film as a protection film 45 is provided on the surface of the drift region 3 for surface protection.

The following section describes an example of fabricating the transistor of the present invention. First, the SiC dielectric substrate 1 is prepared, and the n-type drift region 2 having a predetermined low impurity concentration in a range from $5\times10^{15}$ to $3\times10^{17}$ atm/cm$^3$, and a predetermined thickness in a range from 0.1 to 2.0 μm is formed using vapor phase epitaxy on one surface of the substrate 1. Then, the p-type drift region 3 having almost the same thickness and impurity concentration is formed using vapor phase epitaxy. A SiO$_2$ insulation film is formed on the p-type drift region 3 as the surface protection film 45. Then, the first trench 6A is formed using etching or the like. Then, the n-type buffer region 66 and the p-type collector region 77 are formed sequentially on the inner wall surface of the trench 6A using ion implantation or diffusion. Then, the p-type body region 4 is formed so as to be in contact with the drift regions 2 and 3, and the n-type emitter region 55 is formed in a part of the p-type body region 4 using ion implantation or the like. When the ion implantation is used, it is preferable that the implantation is repeated for several times while implantation energy is changed from high energy to low energy, and an almost uniform impurity concentration distribution is formed in the depth direction. Then, the second trench 9A is formed, the gate insulation film 38 is formed on the top surface including the inner wall surface, and the gate electrode 40 is formed thereon. The SiO$_2$ dielectric oxide film is removed at parts where the emitter electrode 88 and the collector electrode 39 are formed, a metal film such as Al is formed, and the emitter electrode 88 and the collector electrode 39 are formed finally.

The following section describes the operation of the present embodiment. When a high voltage is impressed such that the electric potential of the collector electrode 39 is higher than the electric potential of the emitter electrode 88, a junction constituted by the drift regions 2 and 3 is reverse-biased, depletion layers extend in both of the drift regions 2 and 3, and the entire region is completely depleted in the SiC-IGBT of the present invention. As a result, the electric potential distribution in the drift regions 2 and 3 from the buffer region 66 to the body region 4 becomes almost an equal electric potential distribution. Namely, the electric field is almost uniform across the entire area of the drifts 2 and 3. Because it is possible to increase the impressed voltage as high as the electric field reaches the dielectric breakdown electric field of SiC of about 3 MV/cm, the breakdown voltage can increase. The high breakdown voltage of 6100 V is attained in the present embodiment.

When a high voltage is impressed, an electric field concentration may be present in a neighborhood of the surface of the junction formed by the drift region 3 and the buffer region 66, and the breakdown voltage may be restricted. It is effective to relax the electric field concentration for increasing the breakdown voltage. The electric field relaxing technique, so-called filed plate, which extends the collector electrode 39 over the drift region 3 through the thick surface protection film 45 is applied to the present embodiment for relaxing this electric field concentration. Because the electric field concentration may be present at corners 21A of the trench 9A of the gate electrode 40, and the breakdown voltage may be restricted, it is effective to apply electric field relaxing to these parts as well. The trench 9A is formed so deep as to reach the dielectric substrate 1, and to connect the gate insulation film 38 with the dielectric substrate 1, and the thickness of the insulation film 38 at the corners 21A largely increases in practice for relaxing the electric field in the present embodiment. When it is structured such that the trench 9A is shallow and does not reach the dielectric substrate 1, it is effective to provide a p-type region at the bottom of the trench 9A for relaxing the electric field (a drawing is suppressed), and it attains an effect similar to that of the present embodiment. The same applies to the corners 21B of the trench 6A.

When a voltage higher than the threshold voltage (4 V in the present embodiment) such as 10 V is impressed on the gate electrode 40, an electric field effect through the gate insulation film 38 forms a channel on the surface of the body region 4. As a result, an on state, namely a state where a current flows from the emitter region 55 through this channel is present. When these electrons reach the buffer region 66 through the drift region 2, positive holes flow from the collector region 77 to the drift region 2, and reach the emitter electrode 88 through the body region 4. In this way, the electrons and the positive holes coexist in the drift region 2, a conductivity modulation occurs, and the resistance in the drift region 2 largely decreases. When the impurity concentration is increased for decreasing the resistance, the drift regions 2 and 3 are also completely depleted, and the breakdown voltage increases in the present embodiment. Also, because the conductivity modulation occurs in the drift region 2, and the impurity concentration increases more than the conventional case in the drift region 2, the on-resistance can be decreased largely. Because the impurity concentration can increase by about two digits compared with the conventional case without inversely affecting the breakdown voltage in principle, a large effect of decreasing the on-resistance by about two digits is attained. The on-resistance is 56 mΩcm$^2$ in a voltage range higher than the built-in voltage of SiC (2.7 V), and a low value that is not obtained in the conventional case is attained in a specific example of the present embodiment.

While the thickness and the impurity concentration of the n-type drift region 2 and the p-type drift region 3 formed thereon are set to 0.8 µm and about $8\times10^{16}$ atm/cm$^3$ in the present embodiment, a semiconductor device having a high breakdown voltage and a low loss is obtained as long as the thickness is from 0.1 µm to 2 µm, and the impurity concentration is from about $1\times10^{15}$ atm/cm$^3$ to $3\times10^{17}$ atm/cm$^3$ as experimental data of the inventors indicate in FIG. 2 and FIG. 3. The breakdown voltage decreases suddenly when the thickness is 2 µm or more, or the impurity concentration is $3\times10^{17}$ atm/cm$^3$ or more, because a breakdown occurs as in the conventional structure at the junction constituted by the drift region 2 and the body region 4 before both the drift regions 2 and 3 are completely depleted.

While the individual segments have stripe shapes in the present embodiment, they may take such shapes as circles and rectangles. While the p-type body region 4 has the same thickness as the n-type drift region 3 in the present embodiment, increasing or decreasing the thickness of the p-type body region 4 more or less than the thickness of the n-type body region 3 provides an equivalent effect. When another p-type drift layer is interposed between the p-type body region 4 and the n-type drift region 2 (a drawing is suppressed), an equivalent effect is provided. While the n-type buffer region 66 is formed so deep as to come in contact with the dielectric substrate 1, it may be formed so shallow as to come in contact only with the n-type drift region 2. In this case, though the shallowness makes the fabrication easy, electric field concentration may occur at the corners 21B of the n-type drift regions 2, and the breakdown voltage may decrease.

Eighth Embodiment

Figure 11:
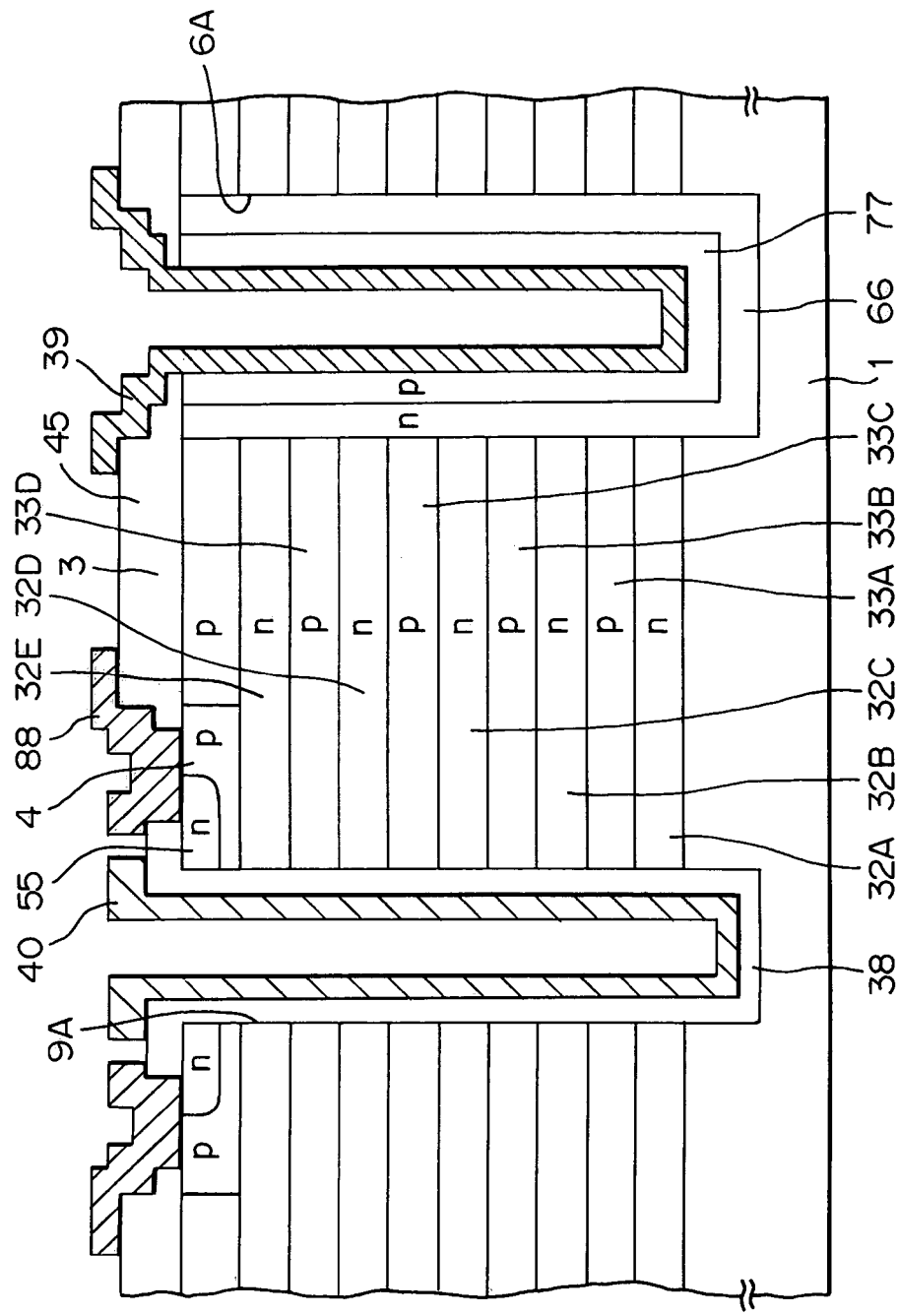
FIG. 11 is a section view of a SiC-IGBT of an eighth embodiment of the present invention.

FIG. 11 is a section view of segments of an IGBT of an eighth embodiment of the present invention. In the drawing, five pairs of the n-type drift regions and p-type drift regions are laminated on the dielectric substrate 1 having the thickness of about 320 µm such that the individual p-type drift regions 33A to 33D are respectively sandwiched between the individual n-type drift regions 32A to 32 E, and the p-type drift region 3 is formed on the upper most layer. The first trench 6A and the second trench 9A are respectively provided so as to reach the dielectric substrate 1 on the both ends of both of the laminated drift regions 32A to 32E and 33A to 33D. The second trench 9A is a gate part, and the gate electrode 40 is provided on the inner wall of it through the gate insulation film 38. The n-type buffer region 66, the p-type collector region 77, and the collector electrode 39 are sequentially provided in the first trench 6A. The p-type body region 4 and the n-type emitter region 55 are provided in a neighborhood of the gate electrode 40 in the upper most layer of the p-type drift region 3, and the emitter electrode 88 which is connected with these regions is provided. The protection film 45 such as a Si oxide film or an Si nitride film is provided on the surface of the p-type drift region 3 for protection. The thickness, the impurity concentration, and the length of both the drift regions 32A to 32E and the drift regions 33A to 33D are about 0.8 µm, about $8\times10^{16}$ atm/cm$^3$, and about 75 µm respectively. The impurity concentration and the thickness of the p-type body region 4 are about $5\times10^{17}$ atm/cm$^3$, and about 0.8 µm respectively, and the impurity concentration and the thickness of the n-type emitter region 55 formed therein are $1\times10^{19}$ atm/cm$^3$, and about 0.2 µm respectively. The impurity concentration of the n-type buffer region 66 in the trench 6A is about $1\times10^{18}$ atm/cm$^3$, and the impurity concentration of the p-type collector region 77 is $1\times10^{20}$ atm/cm$^3$. The depth of both the trenches 6A and 9A is about 10 µm.

The individual n-type drift regions 32B to 32E except for the lower most layer of the n-type drift region 32A are sandwiched between the neighboring regions in the p-type drift regions 3, and 33A to 33D in the SiC-IGBT of the present embodiment. With this constitution, when a high voltage is impressed such that the electric potential of the collector electrode 39 is higher than the electric potential of the emitter electrode 88, depletion layers effectively extend from the n-type drift regions 32A to 32E neighboring on both the upper and lower sides in the individual p-type drift regions 33A to 33D, and the p-type drift regions 33A to 33D are completely depleted. Depletion layers effectively extend from the p-type drift regions 33A to 32D neighboring on both the upper and lower sides in the individual p-type drift regions 32A to 32E, and the p-type drift regions 32A to 32E are completely depleted. As a result, the electric potential distributions in all the drift regions 32A to 32E, and 33A to 33D from the buffer region 66 to the gate electrode 40 are almost equal electric potential distributions, and the electric field is almost uniform across the entire drift regions. Because it is possible to increase the impressed voltage so high that the electric field reaches the dielectric breakdown electric field of SiC of about 3 MV/cm, the breakdown voltage can increase, and a high breakdown voltage of 5800 V is attained in the present embodiment.

On the other hand, when a high voltage is impressed such that the electric potential of the collector electrode 39 is higher than the electric potential of the emitter electrode 88, and simultaneously, a voltage higher than the threshold is impressed on the gate electrode 40 to form the on state, electrons are concentrated on the surfaces of the p-type body region 4 and the individual p-type drift regions 33A to 33D close to the gate electrode 40, and inversion layers are formed. On the other hand, electrons are concentrated on the surfaces of the individual n-type drift regions 32A to 32E close to the gate electrode 40 and accumulation layers are formed. The inversion layer in the p-type body region 4 serves as a channel, and electrons flow from the n-type emitter region 55 into the buffer region 66 through the p-type body region 4 serving as the channel, and the second upper most layer of the n-type drift region 32E. A part of the electrons branch to the fourth upper most layer of the n-type drift region 32D through the accumulation layer of the n-type drift region 32E and the inversion layer of the third upper most layer of the p-type drift region 33D, and flow into the buffer region 66. In the same way, a part of the electrons branch to the sixth, eighth, and tenth upper most layers of the n-type drift regions 32C, 32B, and 32A through the accumulation layer of the n-type drift region 32D and the inversion layer of the p-type drift region 33C, and flow into the buffer region 66. When the electrons reach the buffer region 66, positive holes flow from the p-type collector region 77 into the n-type drift regions 32A to 32E, and reach the emitter electrode 88 though the inversion layers of the p-type drift regions 33A to 33D and the accumulation layers of the n-type drift regions 32A to 32E, and then the p-type body region 4. As a result, the electrons and the positive holes coexist in the n-type drift regions 32A to 32E, conductivity modulation occurs, and the resistance in the n-type drift regions 32A to 32E largely reduces. In this process, the electrons are injected from the neighboring n-type drift regions into the individual p-type drift regions 33A to 33D, a conductivity modulation occurs, and the resistance in the p-type drift regions reduces. Though the resistance tends to increase, and the branch current tends to decrease more or less as the position comes close to the lower layer of the n-type drift region 32A, because the resistances of the accumulation layers in the n-type drift regions 32A to 32E, and the inversion layers in the p-type drift regions 33A to 33D are added, this does not cause a problem in the present embodiment. As a result, the resistance of the n-type drift regions 32A to 32E, and the p-type drift regions 33A to 33E reduces to about one third of a case where a conductivity modulation does not occur, and the on-resistance of the SiC-IGBT largely reduces. In the present embodiment, the on-resistance per unit area is largely reduced to 18 m$\Omega$cm$^2$ while the breakdown voltage is as high as 5800 V.

As described above, the present embodiment provides an effect of largely decreasing the on-resistance while maintaining the high breakdown voltage. The on-resistance decreases as the number of the laminated layers of the pairs of the individual n-type drift regions 32A to 32E and the individual p-type drain regions 33A to 33D increases. However, the number of laminated layers increases excessively, because the resistances increases as the layer becomes close to the low layer of the n-type drift region 32A as described above, a technique to equalize the resistance in the upper and lower n-type drift regions 32E and 32A is necessary. For example, gradually increasing the thickness of the lower layers of the n-type drift regions 32A to 32E and the p-type drift regions 33A to 33E is extremely effective. The increment ratio of thickness of the lower most layer of the drift region 33A depends on the lengths of the individual drift regions, and the number of the pairs of the n-type drift regions, and the p-type drift regions, and it is preferable to set the thickness of the lower most layer of the p-type drift region 33A to that of the upper most layer of the p-type drift region 3 to about 1.3 times when the number of the layers is 15, for example. Though the breakdown voltage decreases to 5200 V, a similar effect is provided for the on-resistance when only the thickness of the n-type drift regions 32A to 32E sequentially increases while the thickness of the p-type drift regions 33A to 33D is maintained constant. In this case, it is also preferable that the thickness of the lower most layer of the n-type drift region 32A is about 1.3 times of the thickness of the upper most layer of the n-type drift region 32E.

It is possible to increase the power capacity when plurality of this semiconductor devices are formed on one substrate, and the same types of the electrodes in the individual semiconductor devices are respectively connected together for a parallel connection. For example, because the parallel connection enables the current capacity of 40 A per chip area of 1 cm$^2$ in the present embodiment, and when the chip area is 25 cm$^2$, a semiconductor having the current capacity of 1000 A is realized.

Ninth Embodiment

Figure 12:
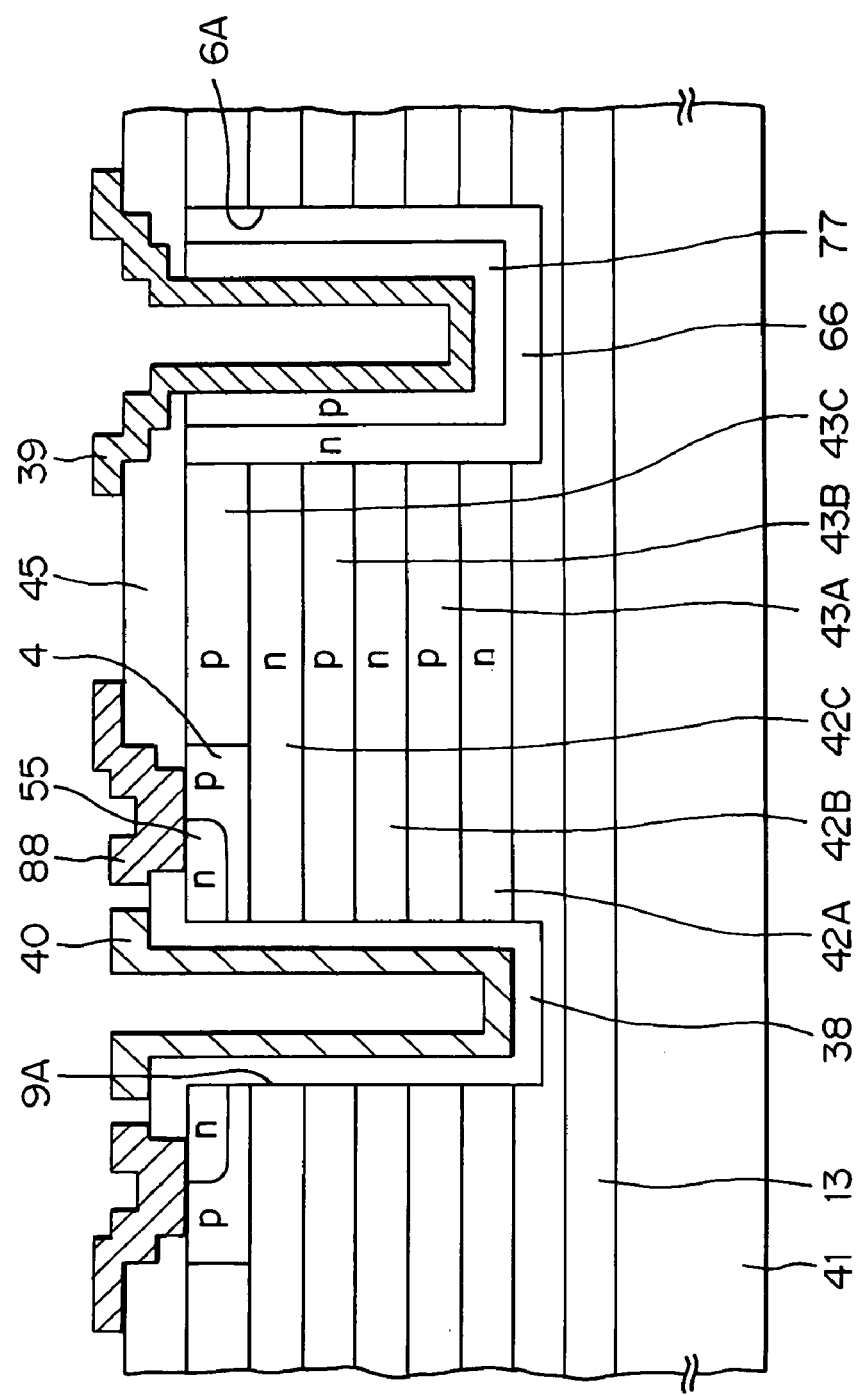
FIG. 12 is a section view of a Si-IGBT of a ninth embodiment of the present invention.

FIG. 12 is a section view of segments of a silicon IGBT (described as Si-IGBT hereafter) of a ninth embodiment of the present invention. A SiO$_2$ insulation film 13 is formed on an Si substrate 41 having the thickness of about 400 μm, and three pairs of n-type drift regions 42A to 42C and p-type drift regions 43A to 43C are sequentially laminated thereon. The first and second trenches 6A and 9A having the depth of about 10 μm are provided so as to reach the insulation film 13 in neighborhoods of the both ends of the laminated drift regions 42A to 42C and 43A to 43C. The second trench 9A is provided for the gate electrode 40, and the gate electrode 40 is provided on the inner wall of the trench 9A through the gate insulation film 38. The n-type buffer region 66, the p-type collector region 77, and the collector electrode 39 are sequentially provided in the first trench 6A. The p-type body region 4 and the n-type emitter region 55 are provided on a side close to the gate electrode 40 in the upper most layer of the p-type drift region 43C, and the emitter electrode 88 is provided so as to be connected with these regions. The protection film 45 such as a Si oxide film or an Si nitride film is provided on the surface of the p-type drift region 43C for protection. The thickness, the impurity concentration, and the length of both the n-type and p-type drift regions 42A to 42C and 43A to 43C are about 1.5 μm, about 2.8×10$^{15}$ atm/cm$^3$, and about 320 μm respectively. The impurity concentration and the thickness of the p-type body region 4 are about 5×10$^{17}$ atm/cm$^3$, and about 0.5 μm respectively, and the impurity concentration and the thickness of the n-type emitter region 55 formed therein are 1×10$^{19}$ atm/cm$^3$, and about 0.2 μm respectively. The impurity concentration of the n-type buffer region 66 in the trench 6A is about 1×10$^{18}$ atm/cm$^3$, and the impurity concentration of the p-type collector region 77 is 1×10$^{20}$ atm/cm$^3$.

The individual n-type drift regions 42B and 42C are sandwiched between the neighboring regions in the p-type drift regions 43A to 43C in the SiC-IGBT of the present embodiment. The p-type drift regions 43A is sandwiched between the neighboring n-type drift regions 42A to 42B. In this state, when a high voltage is impressed such that the electric potential of the collector electrode 39 is higher than the electric potential of the emitter electrode 88, depletion layers effectively extend in the individual drift regions 42A to 42C, and 43A to 43C from the upper and lower sides, and the drift regions are completely depleted. As a result, the electric potential distributions in all the drift regions 42A to 42C, and 43A to 43C from the buffer region 66 to the gate electrode 40 are almost equal electric potential distributions, and the electric field is almost uniform across the entire drift regions. Because it is possible to increase the impressed voltage so high that the electric field reaches the dielectric breakdown electric field of Si of about 0.3 MV/cm, the breakdown voltage can increase, and a high breakdown voltage of 4100 V is attained in the present embodiment.

On the other hand, when a high voltage is impressed such that the electric potential of the collector electrode 39 is higher than the electric potential of the emitter electrode 88, and simultaneously, a voltage higher than the threshold is impressed on the gate electrode 40 to form the on state, electrons are concentrated on the surfaces of the p-type body region 4 and the individual p-type drift regions 43A to 43C close to the gate electrode 40, and inversion layers are formed. Electrons are also concentrated on the surfaces of the individual n-type drift regions 42A to 42C close to the gate electrode 40 and accumulation layers are formed. The inversion layers in the p-type drift regions 43A to 43C serve as a channel, and electrons flow from the n-type emitter region 55 into the buffer region 66 through the channels, and the second upper most layer of the n-type drift region 42C. A part of the electrons pass through the accumulation layer of the n-type drift region 42C and the inversion layer of the third upper most layer of the p-type drift region 43B, and then the fourth layer of the n-type drift region 42B, and flow into the buffer region 66. In the same way, a part of the electrons pass through the accumulation layer of the n-type drift region 42B and the inversion layer of the p-type drift region 43B, and then the sixth layer of the n-type drift region 42A, and flow into the buffer region 66. When the electrons reach the buffer region 66, positive holes flow from the p-type emitter region 77 into the n-type drift regions 42A to 42C, pass though the inversion layers of the p-type drift regions 43A to 43C and the accumulation layers of the n-type drift regions 42A to 42C, and then the p-type body region 4, and reach the emitter electrode 88. In this way, the electrons and the positive holes coexist in the n-type drift regions 42A to 42C, a conductivity modulation occurs, and the resistance in the n-type drift regions 42A to 42C largely reduces. In this process, the electrons are injected from the neighboring n-type drift regions into the individual p-type drift regions, a conductivity modulation occurs, and the resistance in the p-type drift regions reduces. Though the resistance tends to increase, and the branch current tends to decrease more or less as the position comes close to the lower layer of the n-type drift region 42A because the resistances of the accumulation layers in the n-type drift regions 42A to 42C, and the inversion layers in the p-type drift regions 43A to 43C are added, this does not cause a problem in the present embodiment. The resistance of the n-type drift regions 42A to 42C reduces to about one fifth of a case where a conductivity modulation does not occur, and the on-resistance of the field effect transistor largely reduces. In the present embodiment, the on-resistance per unit area is largely reduced to 710 mΩcm$^2$ in a voltage range higher than the built-in voltage while the breakdown voltage is as high as 4100 V.

As described above, the present embodiment provides an effect of largely decreasing the on-resistance while maintaining the high breakdown voltage. The on-resistance decreases as the number of the laminated layers of the pairs of the individual n-type drift regions 42A to 42C and the individual p-type drift regions 43A to 43C increases. However, the number of laminated layers increases excessively, because the resistances increases as the layer becomes close to the low layer of the n-type drift region 42A as described above, a technique to equalize the resistance in the upper and lower n-type and p-type drift regions is necessary. For example, gradually increasing the thickness of the lower layers of the n-type and p-type drift regions is extremely effective. The increment ratio of thickness of the lower most layer of the drift region 42A depends on the lengths of the drift regions, and the number of the pairs of the n-type drift regions 42A to 42C, and the p-type drift regions 43A to 43C, and it is preferable to set the thickness of the lower most layer of the p-type drift region 43A to that of the upper most layer of the p-type drift region 43C to about 1.3 times when the number of the layers is 15, for example. In addition, though the breakdown voltage decreases more or less, a similar effect is provided for the on-resistance when only the thickness of the n-type drift regions sequentially increases while the thickness of the p-type drift regions is maintained constant, and, in this case, it is also preferable that the thickness of the lower most layer of the n-type drift region 42A is about 1.3 times of the thickness of the upper most layer of the n-type drift region 42C.

Tenth Embodiment

Figure 13:
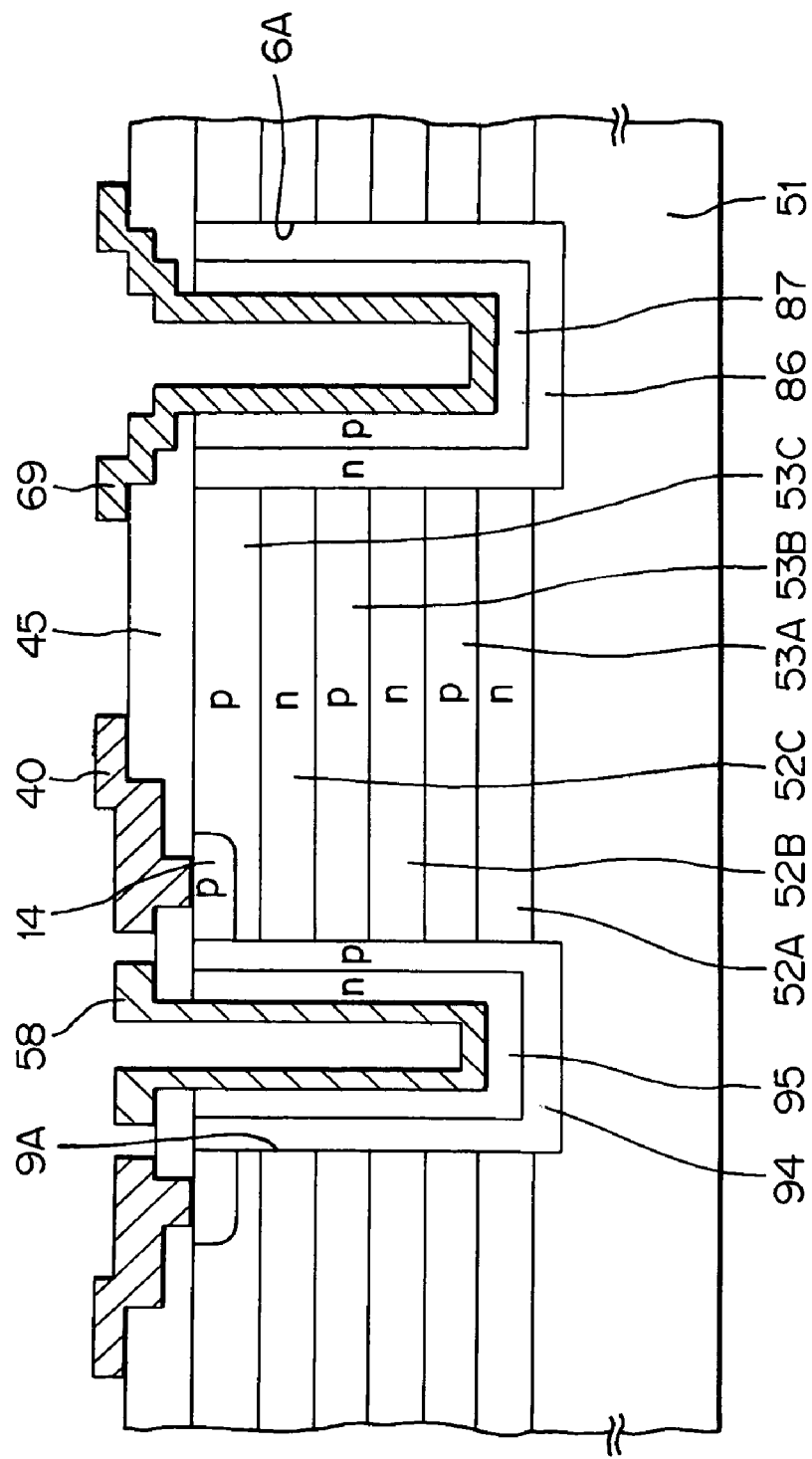
FIG. 13 is a section view of a SiC-GTO of a tenth embodiment of the present invention.

FIG. 13 is a section view of segments of an SiC turn-off thyristor (described as SiC-GTO hereafter) of a tenth embodiment of the present invention. Three pairs of individual n-type drift regions 52A to 52C and p-type drift regions 53A to 53C are sequentially laminated on an SiC substrate 51 having the thickness of about 320 μm. The first and second trenches 6A and 9A are provided so as to reach the dielectric substrate 51 in the neighborhoods of the both ends of the laminated n-type drift regions 52A to 52C and p-type drift regions 53A to 53C. A p-type base region 94, an n-type emitter region 95, and a cathode electrode 58 are sequentially provided on the inner wall of the trench 9A. An n-type base region 86, a p-type emitter region 87, and a collector electrode are sequentially provided on the inner wall of the trench 6A. A p-type contact part 14 connected with the p-type base region 94 is provided on a part close to the n-type emitter region 95 in the upper most layer of the p-type drift region 53C. The contact part 14 is connected with the gate electrode 40. The protection film 45 such as an Si oxide film or an Si nitride film is provided on the surface of the p-type drift region 53C for protection. The thickness, the impurity concentration, and the length of both the n-type and p-type drift regions 52A to 52C and 53A to 53C are about 0.8 μm, about 8×10$^{16}$ atm/cm$^3$, and about 75 μm respectively. The impurity concentration and the thickness of the p-type and n-type base regions 94 and 86 are about 7×10$^{17}$ atm/cm$^3$, and about 1.2 μm respectively. The impurity concentration and the thickness of the n-type and p-type emitter regions 95 and 87 are 1×10$^{20}$ atm/cm$^3$, and about 0.4 μm respectively. The depth of both the trenches 6A and 9A is about 6 μm.

The individual n-type drift regions 52B and 52C are sandwiched between the neighboring regions of the p-type drift regions 53A to 53C in the SiC-GTO of the present embodiment. The p-type drift regions 53A is sandwiched between the neighboring n-type drift regions 52A to 52B. In this state, when a high voltage is impressed such that the electric potential of the anode electrode 69 is higher than the electric potential of the cathode electrode 58, depletion layers effectively extend in the n-type drift regions 52A to 52C from the p-type base region 94 and the neighboring p-type drift regions 53A to 53C, and the drift regions are completely depleted. Simultaneously, depletion layers effectively extend in the p-type drift regions 53A to 53C from the n-type base region 86 and the neighboring n-type drift regions 52A to 53C, and the drift regions are completely depleted. As a result, the electric potential distributions in all the drift regions 52A to 52C, and 53A to 53C from the p-type base region 94 to the n-type base region 86 are almost equal electric potential distributions, and the electric field is almost uniform across the entire drift regions 52A to 52C, and 53A to 53C. Because it is possible to increase the impressed voltage so high that the electric field reaches the dielectric breakdown electric field of SiC of about 3 MV/cm, the breakdown voltage can increase, and a high breakdown voltage of 4500 V is attained in the present embodiment.

In a normal current conducting control, when a high voltage is impressed such that the electric potential of the anode electrode 69 is higher than the electric potential of the cathode electrode 58, and simultaneously, a gate current is flown from the gate electrode 40, the device is turned on, and when the gate current is drained, the device is turned off. Though the resistance of the p-type base region 94 tends to increase, and the branch current tends to decrease more or less as the position comes close to the dielectric substrate 51, this does not cause a problem in the present embodiment. As a result, the resistance between the anode electrode 69 and the cathode electrode 58 is reduced to about one fifth of that of a conventional GTO. In the present embodiment, the on-resistance per unit area is largely reduced to 17 mΩcm$^2$ in a voltage range higher than the built-in voltage while the breakdown voltage is as high as 4500 V.

As described above, the present embodiment provides an effect of largely decreasing the on-resistance while maintaining the high breakdown voltage. The on-resistance decreases as the number the pairs of the n-type drift regions and the p-type drift regions increases. However, when the number of the laminated layers increases excessively, the resistance in the p-type base region 94 increases as described above, and such a defect as the current which flows in the drift region 52A on the side of the substrate 51 is not effectively drained may occur when the device is turned off. If this is the case, the impurity concentration in a part of the p-type base region 94 close to the substrate 51 should increase more or less.

Eleventh Embodiment

Figure 14:
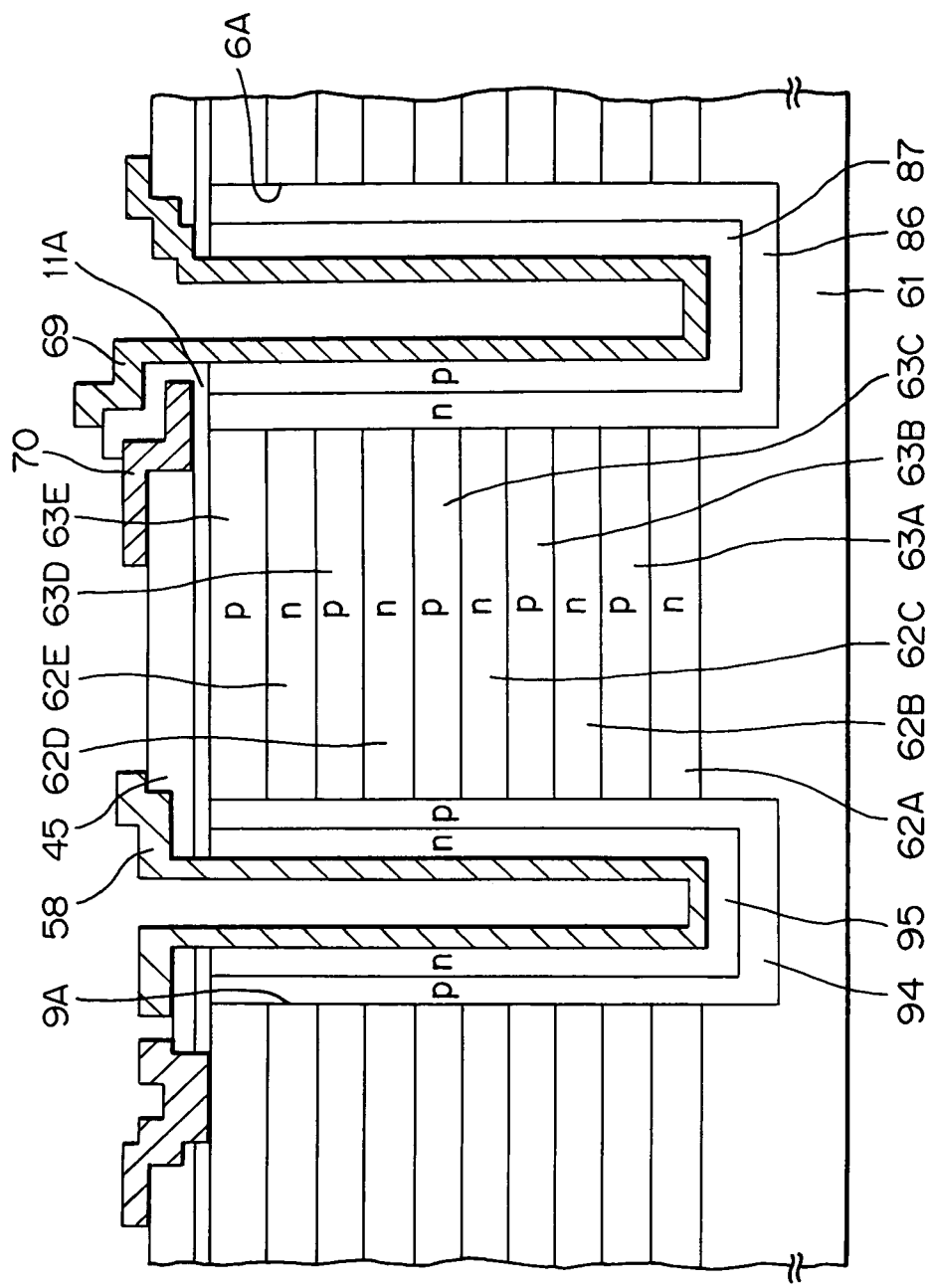
FIG. 14 is a section view of a SiC-MOS thyristor of an eleventh embodiment of the present invention.
Figure 15:
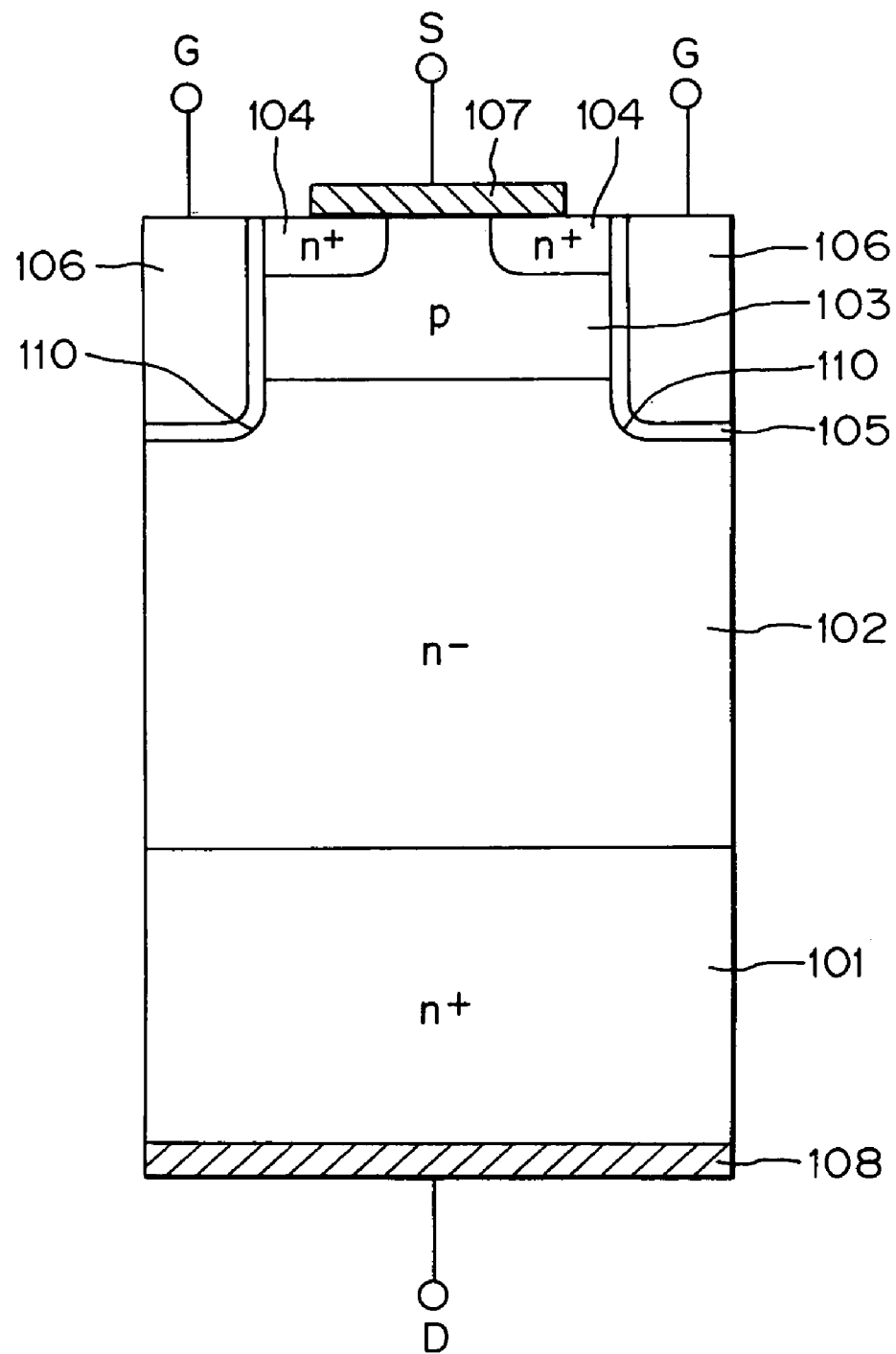
FIG. 15 is a section view of a conventional trench type filed effect semiconductor device.
Figure 16:
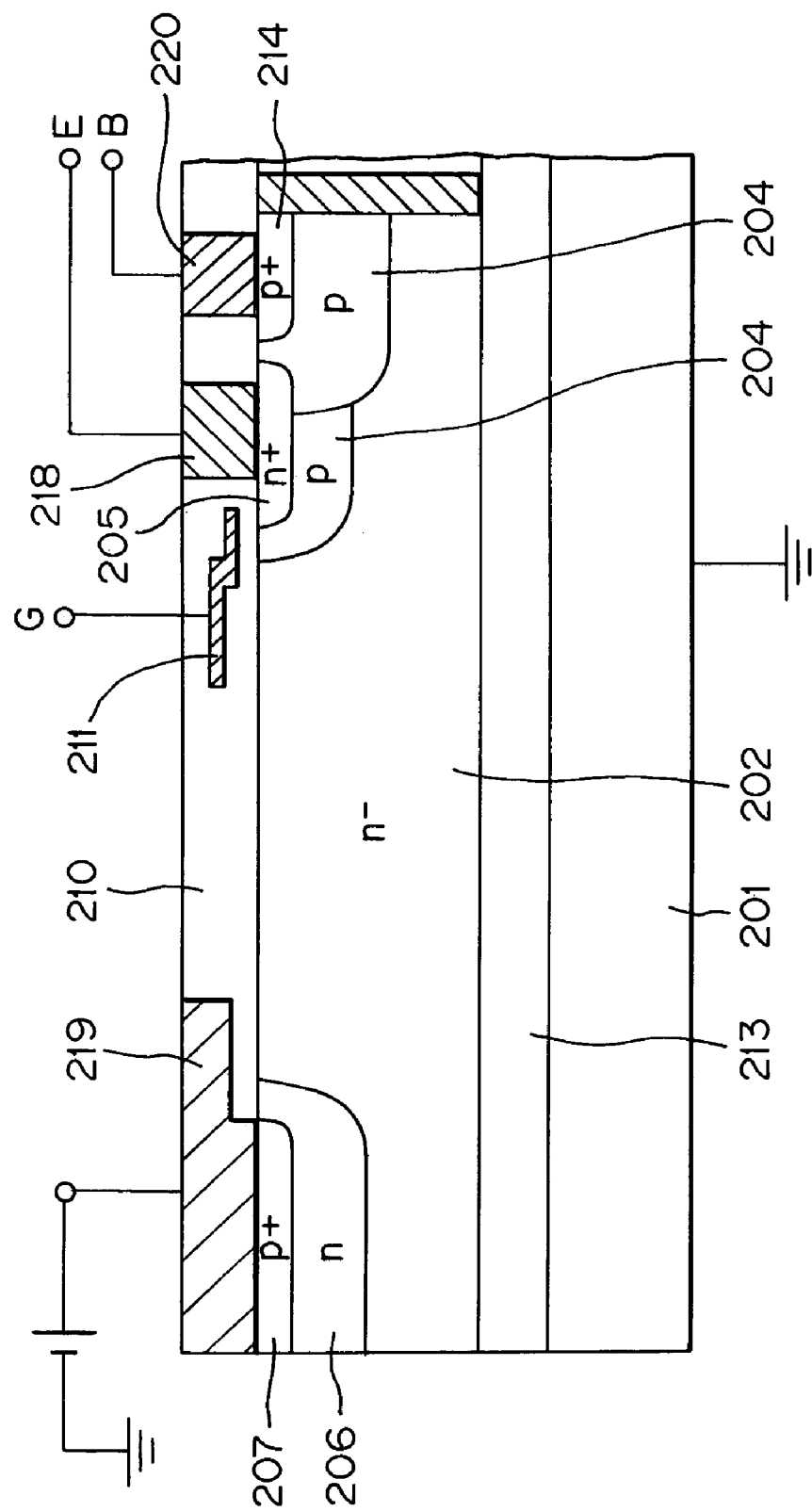
FIG. 16 is a section view of a conventional high withstand voltage semiconductor device.

FIG. 14 is a section view of segments of a SiC-MOS field effect thyristor of an eleventh embodiment of the present invention. Individual p-type drift regions 63A to 63E are respectively sandwiched between individual n-type drift regions 62A to 62E to laminate the five pairs of the n-type drift regions and the p-type drift regions on a SiC substrate 61 having the thickness of about 320 μm. The trenches 6A and 9A are provided so as to reach the dielectric substrate 61 in the neighborhoods of the both ends of the laminated n-type drift regions 62A to 62E and the p-type drift regions 63A to 63E. A p-type base region 94, an n-type emitter region 95, and the cathode electrode 58 are sequentially provided on the inner wall of the one trench 9A. The n-type base region 86, the p-type emitter region 87, and the anode electrode 69 are sequentially provided in the other trench 6A. A gate electrode 70 is provided so as to oppose to the surface of the upper most layer of the p-type drift region 63E, and the ends of the n-type base region 86 and the p-type emitter region 87 through a gate oxide film 11A, and the protection film 45 such as an Si oxide film or an Si nitride film is provided on the other surface. If the conductive types of the individual regions of the drift regions 62A to 63E, the emitter regions 87 and 95, the base regions 86 and 94 are switched from those described above, the gate electrode 70 may be provided so as to oppose to the ends of the p-type base region 94 and the n-type emitter region 95 through the gate oxide film 11A. The thickness, the impurity concentration, and the length of both the n-type and p-type drift regions 62A to 62E and 63A to 63E are about 0.8 μm, about 8×10$^{16}$ atm/cm$^3$, and about 75 μm respectively. The impurity concentration and the thickness of the p-type and n-type base regions 94 and 86 are about 7×10$^{17}$ atm/cm$^3$, and about 1.2 μm respectively. The impurity concentration and the thickness of the n-type and p-type emitter regions 95 and 87 are 1×10$^{20}$ atm/cm$^3$, and about 0.4 μm respectively. The depth of both the trenches 6A and 9A is about 10 μm.

The individual n-type drift regions 62B to 62E are sandwiched between the neighboring regions of the p-type drift regions 63A to 63E in the SiC-MOS field effect thyristor of the present embodiment. The p-type drift region 63A is sandwiched between the neighboring n-type drift regions 62A and 62B. As a result, when a high voltage is impressed such that the electric potential of the anode electrode 69 is higher than the electric potential of the cathode electrode 58, depletion layers effectively extend in the n-type drift regions 62A to 62E from the p-type base region 94 and the p-type drift regions 63A to 63E, and the drift regions are completely depleted. Simultaneously, depletion layers effectively extend in the p-type drift regions 63A to 63E from the n-type base region 86 and the n-type drift regions 62A to 62E, and the drift regions are completely depleted. As a result, the electric potential distributions in all the drift regions 62A to 62E, and 63A to 63E between the p-type base region 94 and the n-type base region 86 are almost equal electric potential distributions, and the electric field is almost uniform across the entire drift regions. Because it is possible to increase the impressed voltage so high that the electric field reaches the dielectric breakdown electric field of SiC of about 3 MV/cm, the breakdown voltage can increase. A high breakdown voltage of 4700 V is attained in the present embodiment.

In a normal current conducting control, a high voltage is impressed such that the electric potential of the anode electrode 69 is higher than the electric potential of the cathode electrode 58. Also, a voltage is impressed on the gate electrode 70 such that its electric potential is lower than the electric potential of the anode electrode 69. When this voltage is more than a threshold voltage of the surface of the n-type base region 86 under the gate electrode 70, a channel is formed on the surface of the n-type base region 86, and positive holes flow from the p-type emitter region 87 into the p-type drift region 63E. When these positive holes reach the p-type base region 94, an injection of electrons from the n-type emitter region 95 is promoted, and the electrons first flow into the upper most layer of the p-type drift region 63E. These electrons turn on an npn transistor constituted by the n-type emitter region 95, the p-type base region 94 and the upper most layer of the p-type drift region 63E, and the n-type base region 86, and promote the injection of the positive holes from the p-type emitter region 87 into the n-type base region 86. This injection of the positive holes turns on a pnp transistor constituted by the p-type emitter region 87, the n-type base region 86, and the p-type drift region 63E, and consequently turns on a pnppn thyristor including the upper most layer of the p-type drift region 63E. In this process, because the electric potential of the n-type drift region 62E under the upper most layer of the p-type drift region 63E is higher than the electric potential of the upper most layer of the p-type drift region 63E, a part of the electrons injected from the n-type emitter region 95 into the p-type drift region 63E flow into the n-type drift region 62E, reach the n-type base region 86, and promote an injection of the positive holes from the p-type emitter region 87 into the n-type base region 86, and the n-type drift region 62E. As a result, a pnp transistor constituted by the p-type emitter region, the n-type base region 86, the n-type drift region 62E, and the p-type base region 94 turns on, a large amount of the positive holes flow through the pnp transistor, and promote an injection of a large amount of the electrons from the n-type emitter region 95. As a result, an npn transistor constituted by the n-type emitter region 95, the p-type base region 94, the n-type drift region 62E, and the n-type base region 86 turns on, and promotes an injection of an even larger amount of the positive holes into the n-type base region 86. This induces a positive feedback amplification operation by the pnp and npn transistors, and consequently a pnnpn thyristor turns on. In this process, because the electric potential of the third layer of the p-type drift region 63D is lower than the electric potential of the second layer of the n-type drift region 62E, a part of the positive holes injected from the p-type emitter region 87 into the n-type drift region 62E flow in the p-type drift region 63D, and reach the p-type base region 94. This promotes an injection of the electrons from the n-type emitter region 95 into the p-type base region 94 and the p-type drift region 63D, then turns on a third layer of an npn transistor, and consequently turns on a third layer of an pnp transistor. As a result, a third layer of a pnppn thyristor constituted by the third layer of the npn transistor and the pnp transistor turns on. In this way, forth, fifth, sixth, seventh, eighth, ninth, and tenth layers of thyristors including the n-type and p-type drift regions 62D, 63C, 62C, 63B, 62B, 63A, and 62A sequentially turn on, and consequently, the entire SiC-MOS field effect thyristor turns on.

In the present embodiment, the on-resistance per unit area is largely reduced to 11 m$\Omega$cm$^2$ in a voltage range higher than the built-in voltage while the breakdown voltage is as high as 4700 V. Because this device is a MOS gate type semiconductor device, the power consumption of a gate circuit including the gate electrode 70 can be reduced largely compared with the SiC-GTO of the tenth embodiment.

As described above, the present embodiment presents such an effect as the on-resistance is largely reduced while the breakdown voltage is maintained high, the power consumption of the semiconductor device is largely reduced, and the power consumption of a gate drive circuit connected with the gate electrode 80 is reduced. The on-resistance can be reduced more as the number of the laminated layers of the n-type drift regions 62A to 62E, and the p-type drift regions 63A to 63E.

While the previous section details the first to eleventh embodiments, the present invention includes a wider application range, and derived structures. For example, when a large number of basic elements formed on the same substrate are connected in parallel, a large current and a high capacity are realized. The SiC dielectric substrate is not limited to the SiC substrate including vanadium, and a sapphire dielectric substrate and a gallium arsenide substrate including chrome may be used.

While the devices using Si and SiC are described in the individual embodiments, the present embodiment is applicable to devices using other semiconductor materials such as diamond, gallium nitride, aluminum nitride, and zinc sulfide. While the inner wall surfaces of the trenches 6A and 9A in the embodiments are approximately vertical, the inner wall surfaces may be formed as a groove having a gently sloped cone shape. When constituted in this way, the buried regions and the electrode are formed easily if the number of the pairs of the n-type and p-type drift layers is ten or more, and the this constitution is advantageous for reducing the cost and increasing the yield.

The constitutions of the present invention can be applied when the n-type regions are replaced with p-type regions, and the p-type regions are replaced with n-type regions in the individual embodiments.

The breakdown voltage of the semiconductor devices of the present invention is affected by the difference in the thickness and the impurity concentration between the p-type drift regions and the n-type drift regions. To effectively attain the purpose of the present invention, it is preferable that the differences in the thickness and the impurity concentration between the p-type drift regions and the n-type drift regions is ±20% or less, and ±250% or less respectively.

INDUSTRIAL APPLICABILITY

As detailed in the individual embodiments of the present invention, the semiconductor device is formed on the dielectric wide gap semiconductor substrate, the thin p-type and n-type drift regions which are completely depleted when a high voltage close to the rated voltage are laminated between the body region and the drain region. With this constitution, the depletion layers extending from the junctions constituted by both the p-type and n-type drift regions completely deplete the drift regions when a high voltage is impressed while the impurity concentration is high. As a result, the drift regions have an equal electric potential distribution, namely a constant electric field, and a high breakdown voltage is realized. Because the impurity concentration is high, the on-resistance can be reduced simultaneously, and because the local concentration of the electric field is decreased, and the maximum electric field is low when a high voltage is impressed, the reliability increases.

The p-type and n-type bipolar drift regions are laminated between the body region and the buffer region, or the n-type base region and the p-type base region, and are so thin as to be completely depleted between them when a high voltage close to the rated voltage is impressed. With this constitution, the depletion layers extending mainly from the junctions constituted by both the p-type and n-type drift regions completely deplete both of the drift regions when a high voltage is impressed while the impurity concentration is high. As a result, an equal electric potential distribution, namely a constant electric field is present between them, and a high breakdown voltage is realized. Because the impurity concentration is high, the on-resistance can be reduced. Because the local concentration of the electric field is decreased, and the maximum electric field is low when a high voltage is impressed, the reliability increases.

The invention claimed is:
1. A wide gap semiconductor device comprising:
   multiple pairs of a first conductive type first drift region and a second conductive type second drift region formed on a high resistance substrate of a wide gap semiconductor;
   a first conductive type buried region formed on an inner wall surface of a first trench reaching to said substrate through said multiple pairs of said first and second drift regions;
   a first electrode formed in said buried region;
   a second conductive type body region formed in the drift regions on the uppermost layer of said multiple pairs of the first and the second drift regions;
   a first conductive type source region formed in a part of said body region;
   an insulation film formed on an inner wall surface of a second trench provided at a position separated from said first trench by a predetermined distance, and reaching to said substrate through said multiple pairs of said first and second drift regions, said body region, and said first conductive type source region;
   a control electrode provided on the inner wall surface of said second trench through said insulation film
   a second electrode formed in said source region and in said body region; and
   wherein th thickness of the individual drift regions of said multiple pairs of the first drift region and the second drift region is large when the distance from the substrate is short, and gradually decreases as the distance from the substrate increases.

2. The wide gap semiconductor device according to claim 1, wherein the thickness of said first and second drift regions is selected such that said first and second drift regions virtually become complete depletion layers when a voltage lower than a rated voltage is impressed between said first electrode and second electrode.

3. A wide gap semiconductor device comprising:

multiple pairs of a first conductive type first drift region and a second conductive type second drift region formed on a high resistance substrate of a wide gap semiconductor;

a first conductive type buried region formed on an inner wall surface of a first trench reaching to said substrate through said multiple pairs of said first and second drift regions;

a first electrode formed in said buried region;

a second conductive type body region formed in the drift regions on the uppermost layer of said multiple pairs of the first and the second drift regions;

a first conductive type source region formed in a part of said body region;

an insulation film formed on an inner wall surface of a second trench provided at a position separated from said first trench by a predetermined distance, and reaching to said substrate through said multiple pairs of said first and second drift regions, said body region, and said first conductive type source region;

a control electrode provided on the inner wall surface of said second trench through said insulation film; and a second electrode formed in said source region and in said body region; and wherein the thickness of the individual drift regions of said multiple pairs of said second drift region is fixed and the thickness of the individual drift regions of said multiple pairs of said first drift regions increases as the distance from said substrate decreases.

4. The wide gap semiconductor device according to claim 3, wherein the thickness of said first and second drift regions is selected such that said first and second drift regions virtually become complete depletion layers when a voltage lower than a rated voltage is impressed between said first electrode and second electrode.

* * * * *